(12) United States Patent
Yamada et al.

(10) Patent No.: US 9,972,758 B2
(45) Date of Patent: May 15, 2018

(54) ULTRAVIOLET LIGHT EMITTING DEVICE

(71) Applicant: Soko Kagaku. Co., Ltd., Ishikawa (JP)

(72) Inventors: Kiho Yamada, Aichi (JP); Shoko Nagai, Aichi (JP); Yuta Furusawa, Aichi (JP); Akira Hirano, Aichi (JP); Masamichi Ippommatsu, Aichi (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 0 days. days.

(21) Appl. No.: 14/916,992

(22) PCT Filed: Sep. 10, 2014

(86) PCT No.: PCT/JP2014/073906
§ 371 (c)(1),
(2) Date: Mar. 4, 2016

(87) PCT Pub. No.: WO2015/037608
PCT Pub. Date: Mar. 19, 2015

(65) Prior Publication Data
US 2016/0218259 A1 Jul. 28, 2016

(30) Foreign Application Priority Data
Sep. 12, 2013 (JP) .................. 2013-189796

(51) Int. Cl.
*H01L 33/56* (2010.01)
*C08F 32/04* (2006.01)
*H01L 33/54* (2010.01)

(52) U.S. Cl.
CPC .............. *H01L 33/56* (2013.01); *C08F 32/04* (2013.01); *H01L 33/54* (2013.01);
(Continued)

(58) Field of Classification Search
CPC ........... H01L 33/56; H01L 33/60; C08F 32/04
(Continued)

(56) References Cited

U.S. PATENT DOCUMENTS

2006/0138443 A1* 6/2006 Fan .................. H01L 33/56
257/100
2007/0267645 A1 11/2007 Nakata et al.
(Continued)

FOREIGN PATENT DOCUMENTS

JP 2003008073 A 1/2003
JP 2006348088 A 12/2006
(Continued)

OTHER PUBLICATIONS

PCT/JP2014/073906—International Search Report with english translation dated Dec. 2, 2014, 3 pgs (WO 2015037608).

*Primary Examiner* — Moazzam Hossain
*Assistant Examiner* — Warren H Kilpatrick
(74) *Attorney, Agent, or Firm* — Haynes Beffel & Wolfeld LLP

(57) ABSTRACT

An ultraviolet light emitting device having high quality and high reliability is provided by preventing deterioration of electrical characteristics which is associated with an ultraviolet light emission operation and caused by a sealing resin. The ultraviolet light emitting device is an ultraviolet light emitting device including: an ultraviolet light emitting element (2) composed of a nitride semiconductor; and an ultraviolet-transparent sealing resin (3) covering the ultraviolet light emitting element (2), wherein at least a specific portion (3a) of the sealing resin (3), which is in contact with pad electrodes (16) and (17) of the ultraviolet light emitting element (2), is a first type amorphous fluororesin, a terminal functional group of a polymer or a copolymer that forms the first type amorphous fluororesin is a COOH group or a COOR group which is a reactive terminal functional group
(Continued)

bondable to a metal that forms the pad electrodes (16) and (17), and a light emission wavelength range in the ultraviolet light emitting element (2) exists on a longer-wavelength side as compared to the long-wavelength edge of an absorption wavelength range in the amorphous fluororesin.

10 Claims, 19 Drawing Sheets

(52) U.S. Cl.
CPC ............... *H01L 2224/14* (2013.01); *H01L 2224/16225* (2013.01); *H01L 2924/181* (2013.01)

(58) Field of Classification Search
USPC .................................................. 257/100, 98
See application file for complete search history.

(56) References Cited

U.S. PATENT DOCUMENTS

| | | | |
|---|---|---|---|
| 2013/0037842 A1* | 2/2013 | Yamada | .................. H01L 33/60 257/98 |
| 2015/0291834 A1* | 10/2015 | Isotani | .................... C08L 63/00 257/100 |

FOREIGN PATENT DOCUMENTS

| | | | |
|---|---|---|---|
| JP | 2007311707 A | | 11/2007 |
| JP | 2011016074 A | | 1/2011 |
| JP | 2011035236 A | | 2/2011 |
| WO | 2010074038 A1 | | 7/2010 |

\* cited by examiner

| Sample | Amorphous Fluororesin | Terminal Functional Group | Center Emission Wavelength |
|---|---|---|---|
| #1 | First Type / Type A | COOH | 260nm |
| #2 | First Type / Type A | COOH | 260nm |
| #3 | First Type / Type A | COOH | 270nm |
| #4 | First Type / Type A | COOH | 290nm |
| #5 | First Type / Type A | COOH | 268nm |
| #6 | First Type / Type A | COOH | 263nm |
| #7 | First Type / Type A | COOH | 265nm |
| #8 | First Type / Type A | COOH | 307nm |
| #9 | First Type / Type B | COOR | 265nm |
| #10 | First Type / Type B | COOR | 305nm |
| #11 | Second Type / Type C | $CF_3$ | 260nm |
| #12 | Second Type / Type C | $CF_3$ | 269nm |
| #13 | Second Type / Type C | $CF_3$ | 265nm |
| #14 | Second Type / Type C | $CF_3$ | 304nm |
| #15 | None | | 260nm |

Fig. 8

ULTRAVIOLET LIGHT EMITTING DEVICE

TECHNICAL FIELD

The present invention relates to an ultraviolet light emitting device, and particularly to an ultraviolet light emitting device using an amorphous fluororesin as a sealing resin for sealing an ultraviolet light emitting element.

BACKGROUND ART

There have been heretofore many nitride semiconductor light emitting elements, such as LEDs (light emitting diodes) and semiconductor lasers, in which a light emitting element structure including a plurality of nitride semiconductor layers is formed on a substrate of sapphire or the like by epitaxial growth. The nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light emitting structure has a double-hetero structure in which an active layer including a nitride semiconductor layer of single-quantum-well structure (SQW) or multi-quantum-well structure (MQW) is sandwiched between an n-type nitride semiconductor layer and a p-type nitride semiconductor layer. When the active layer is an AlGaN-based semiconductor layer, by adjusting an AlN molar fraction (also referred to as an Al composition ratio), band gap energy can be adjusted within a range where band gap energies that can be taken by GaN and AlN (about 3.4 eV and about 6.2 eV) are lower and upper limits, so that an ultraviolet light emitting element having a light emission wavelength of about 200 nm to about 365 nm is obtained. Specifically, when a forward-current is caused to pass from the p-type nitride semiconductor layer to the n-type nitride semiconductor layer, light emission matching the band gap occurs in the active layer.

The nitride semiconductor ultraviolet light emitting element is put to practical use after being sealed with an ultraviolet-transparent resin such as a fluorine-based resin or a silicone resin as disclosed in FIGS. 4, 6 and 7 etc. in Patent Document 1 or FIGS. 2, 4 and 6 etc. in Patent Document 2. The sealing resin protects an inside ultraviolet light emitting element from an outside atmosphere to prevent degradation of the light emitting element due to ingress of moisture, oxidation and the like. Further, the sealing resin may be provided as a refractive index difference mitigation material for improving light extraction efficiency by mitigating a reflection loss of light resulting from a refractive index difference between a light condensing lens and an ultraviolet light emitting element or a refractive index difference between a space to be irradiated with ultraviolet light and an ultraviolet light emitting element. Further, irradiation efficient can be improved by shaping the surface of the sealing resin into a light condensing curved surface such as a spherical surface.

PRIOR ART DOCUMENTS

Patent Documents

Patent Document 1: Japanese Patent Application Publication No. 2007-311707
Patent Document 2: U.S. Patent Application Publication No. 2006/0138443
Patent Document 3: Japanese Patent Application Publication No. 2006-348088
Patent Document 4: Japanese Patent Application Publication No. 2011-016074

SUMMARY OF THE INVENTION

Problems to be Solved by the Invention

While use of a fluorine-based resin and a silicone resin etc. as a sealing resin for an ultraviolet light emitting element has been proposed as described above, the silicone resin is known to be progressively degraded upon exposure to a large amount of ultraviolet light. Particularly, enhancement of power of the ultraviolet light emitting element is promoted, so that the energy density of emitted light tends to increase, and the associated increase in power consumption causes an increase in heat generation, thus raising the problem of degradation of the sealing resin by such heat generation and ultraviolet light having a high energy density.

Fluorine-based resins are known to have excellent heat resistance and high ultraviolet light resistance, but general fluororesins such as those of polytetrafluoroethylene are opaque. The reason why such fluorine-based resins are opaque is that since the polymer chain is linear and rigid, and is easily crystallized, a crystalline portion and an amorphous portion coexist, and light is scattered at an interface therebetween.

Thus, for example, Patent Document 3 proposes that transparency to ultraviolet light is improved by using an amorphous fluororesin as a sealing resin for an ultraviolet light emitting element. Examples of amorphous fluororesins include one with a fluororesin of a crystalline polymer copolymerized and made amorphous as a polymer alloy, a copolymer of perfluorodioxole (trade name: Teflon AF (registered trademark) produced by E. I. du Pont de Nemours and Company) and a cyclopolymerization product of per-fluorobutenyl vinyl ether (trade name: CYTOP (registered trademark) produced by ASAHI GLASS Co., Ltd.). The latter fluororesin of a cyclopolymerization product has a cyclic structure on the main chain, is therefore made easily amorphous, and has high transparency.

For example, as shown in Patent Document 4, amorphous fluororesins are broadly classified into bondable fluororesins having a functional group capable of being bonded to a metal and non-bondable fluororesins having a functional group that is hardly bonded to a metal. Thus, Patent Document 4 proposes that bondability between a base etc. and a fluororesin is improved by using a bondable fluororesin for a surface of the base, on which a LED chip is mounted, and a portion covering the LED chip. Similarly, some of manufacturers that provide amorphous fluororesins recommend use of a bondable fluororesin.

However, as a result of extensively conducting studies by the inventors of the present application, it has been confirmed that in the case where a bondable amorphous fluororesin is used for a portion covering a pad electrode of a nitride semiconductor ultraviolet light emitting element, electrical characteristics of the ultraviolet light emitting element are deteriorated when an ultraviolet light emission operation is performed by applying a forward voltage between metal electrode wirings connected to a p-electrode and an n-electrode, respectively, of the ultraviolet light emitting element. Specifically, it has been confirmed that a resistant leak current path is formed between the p-electrode and the n-electrode of the ultraviolet light emitting element. Here, it is considered that when the amorphous fluororesin is a bondable amorphous fluororesin having a reactive terminal functional group capable of being bonded to a metal, a reactive terminal functional group in the bondable amorphous fluororesin irradiated with high-energy ultraviolet light is separated and radicalized by a photochemical reaction, and coordinate-bonded to metal atoms which form a pad electrode, so that the metal atoms are separated from the pad electrode. Further, it is considered that an electric field is applied between pad electrodes during the light emission operation, and resultantly the metal atoms migrate to form a resistant leak current path, so that a short-circuit occurs between the p-electrode and the n-electrode of the ultraviolet light emitting element.

The present invention has been devised in view of the above-mentioned problems, and an object of the present invention is to provide an ultraviolet light emitting device having high quality and high reliability by preventing deterioration of electrical characteristics which is associated with an ultraviolet light emission operation and caused by a sealing resin.

Means for Solving the Problem

The inventors of the present application have extensively conducted studies, and resultantly found that even when a bondable amorphous fluororesin composed of a polymer or a copolymer and having a reactive functional group as a terminal functional group thereof is used, the light emission wavelength range in an ultraviolet light emitting element is adjusted so as to be positioned on a higher-wavelength side as compared to the absorption wavelength range in the bondable amorphous fluororesin, and thus the reactive functional group is inhibited from being separated and radicalized, so that deterioration of electrical characteristics, which is associated with an ultraviolet light emission operation and caused by a sealing resin, can be prevented, leading to the present invention shown below.

Further, the inventors of the present application have found that when the reactive functional group is a COOH group or a COOR group (where R is an alkyl group), the long-wavelength edge of the absorption wavelength range in the bondable amorphous fluororesin exists in the vicinity of 260 to 280 nm or in the vicinity of 255 to 275 nm, and have also found that deterioration of the electrical characteristics can be prevented when the wavelength at the short-wavelength edge of a light emission wavelength range where the light emission spectral intensity (optical intensity in the light emission spectrum) of the ultraviolet light emitting element is 1% or more of the peak value is limited to 265 nm or more in the case where the reactive functional group is a COOH group, and limited to 260 nm or more in the case where the reactive functional group is a COOR group, or the center emission wavelength is limited to 290 nm or more, further preferably 300 nm or more.

For achieving the object described above, the present invention provides an ultraviolet light emitting device comprising: an ultraviolet light emitting element composed of a nitride semiconductor; and an ultraviolet-transparent sealing resin covering the ultraviolet light emitting element, wherein as a first feature, at least a specific portion of the sealing resin, which is in contact with a pad electrode of the ultraviolet light emitting element, is a first type amorphous fluororesin, a terminal functional group of a polymer or a copolymer that forms the first type amorphous fluororesin includes a COOH group or a COOR group as a reactive functional group bondable to a metal that forms the pad electrode, with the proviso that R in the COOR is an alkyl group, and a wavelength at the short-wavelength edge of a light emission wavelength range where a light emission spectral intensity of the ultraviolet light emitting element is 1% or more of a peak value is 265 nm or more in the case where the terminal functional group is the COOH group, and 260 nm or more in the case where the terminal functional group is the COOR group.

Further preferably, in the ultraviolet light emitting devices according to the first feature, the center emission wavelength of the ultraviolet light emitting element is 290 nm or more and 365 nm or less.

For achieving the object described above, the present invention provides an ultraviolet light emitting device comprising: an ultraviolet light emitting element composed of a nitride semiconductor; and an ultraviolet-transparent sealing resin covering the ultraviolet light emitting element, wherein as a second feature, at least a specific portion of the sealing resin, which is in contact with a pad electrode of the ultraviolet light emitting element, is a first type amorphous fluororesin, a terminal functional group of a polymer or a copolymer that forms the first type amorphous fluororesin includes a COOH group or a COOR group as a reactive functional group bondable to a metal that forms the pad electrode, with the proviso that R in the COOR is an alkyl group, and a center emission wavelength of the ultraviolet light emitting element is 290 nm or more and 365 nm or less.

Further preferably, in the ultraviolet light emitting devices according to the first or second feature, the center emission wavelength of the ultraviolet light emitting element is 300 nm or more and 365 nm or less.

For achieving the object described above, the present invention provides an ultraviolet light emitting device comprising: an ultraviolet light emitting element composed of a nitride semiconductor; and an ultraviolet-transparent sealing resin covering the ultraviolet light emitting element, wherein as a third feature, at least a specific portion of the sealing resin, which is in contact with a pad electrode of the ultraviolet light emitting element, is a first type amorphous fluororesin, a terminal functional group of a polymer or a copolymer that forms the first type amorphous fluororesin is a reactive terminal functional group bondable to a metal that forms the pad electrode, and the short-wavelength edge of a light emission wavelength range where a light emission spectral intensity of the ultraviolet light emitting element is 1% or more of the peak value exists on a longer-wavelength side as compared to the long-wavelength edge of an absorption wavelength range in the first type amorphous fluororesin.

Further preferably, in the ultraviolet light emitting device according to the first to third features, a structural unit that forms the polymer or the copolymer has a fluorine-containing aliphatic cyclic structure.

Further, as a fourth feature, the ultraviolet light emitting device according to the first to third features comprises a base with metal electrode wiring formed on a part of a surface of a substrate, the ultraviolet light emitting element is placed on the base, and the pad electrode of the ultraviolet light emitting element is electrically connected to the metal electrode wiring.

Further preferably, in the ultraviolet light emitting device according to the fourth feature, the pad electrode and the metal electrode wiring face each other, and are electrically and physically connected to each other with a bump material interposed therebetween, and an air gap between a side of the ultraviolet light emitting element provided with the pad electrode and an upper surface of the base is filled with the first type amorphous fluororesin.

Further preferably, in the ultraviolet light emitting device according to the fourth feature, a portion of the sealing resin, which is in contact with the metal electrode wiring, is the first type amorphous fluororesin.

Further, as a fifth feature, the ultraviolet light emitting device according to the first to fourth features is an ultraviolet light emitting device, wherein a portion other than the specific portion in the sealing resin is the first type amorphous fluororesin, or a second type amorphous fluororesin having a terminal functional group different from that of the first type amorphous fluororesin, and a terminal functional group of a polymer or a copolymer that forms the second type amorphous fluororesin is a nonreactive functional group which is not bondable to a metal that forms the pad electrode.

Further, in the ultraviolet light emitting device according to the fifth feature, the nonreactive functional group is preferably a perfluoroalkyl group, and particularly the nonreactive functional group is preferably $CF_3$.

Effect of the Invention

According to the ultraviolet light emitting device according to the first to fifth features, even when the terminal functional group of the first type amorphous fluororesin to be used for the sealing resin is a reactive functional group, substantially the whole region of the light emission wavelength range in the ultraviolet light emitting element is outside the absorption wavelength range in the first type amorphous fluororesin, and therefore even when the resin is irradiated with the relatively long-wavelength ultraviolet light, a coordinate bond by a photochemical reaction is hard to occur between the reactive functional group and metal atoms that form pad electrodes, so that a short-circuit between the pad electrodes is prevented. As a result, deterioration of electrical characteristics, which is associated with an ultraviolet light emission operation and caused by a sealing resin, is prevented, so that an ultraviolet light emitting device having high quality and high reliability can be provided.

Particularly, in the case where the terminal functional group is a COOH group or a COOR group as in the ultraviolet light emitting device according to the first or second feature, the long-wavelength edge of the absorption wavelength range in the first type amorphous fluororesin exists in the vicinity of 260 to 280 nm or in the vicinity of 255 to 275 nm, and therefore by setting the center emission wavelength of the ultraviolet light emitting element to 290 nm or more, more preferably 300 nm or more, a short-circuit between the pad electrodes is prevented.

Further, since the reactive functional group is bondable to a metal, the first type amorphous fluororesin has higher bondability to the pad electrode of the ultraviolet light emitting element and the surface of a metal of a base such as a sub-mount on which the ultraviolet light emitting element is placed, as compared to the second type amorphous fluororesin having a nonreactive functional groups as a terminal functional group, and therefore the sealing resin can be stably fixed on the periphery of the ultraviolet light emitting element.

BRIEF DESCRIPTION OF THE DRAWINGS

FIG. 8 is a table collectively showing the details of experimental samples used in an experiment for verifying an effect of suppressing a light emission output defect of the ultraviolet light emitting device according to the present invention.

DESCRIPTION OF EMBODIMENT

Figure 1:
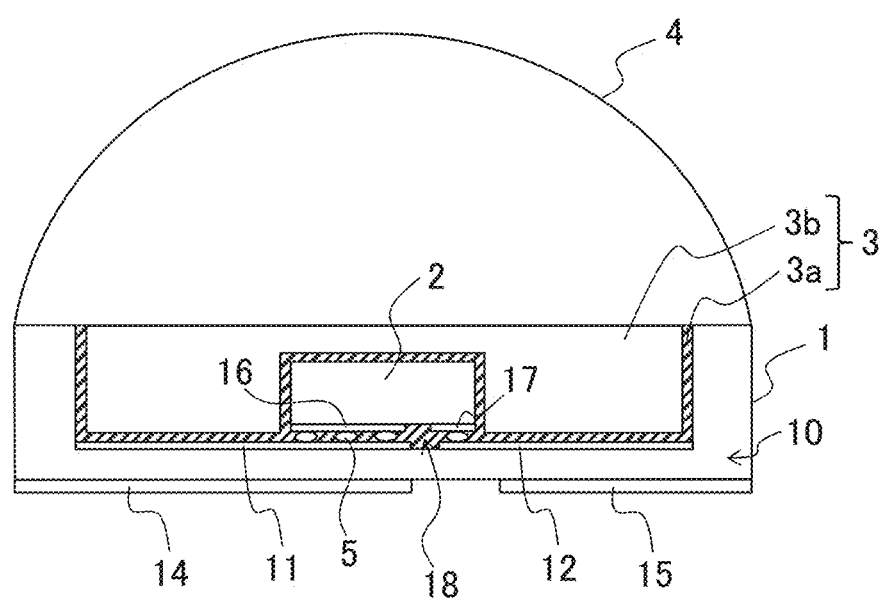
FIG. 1 is a sectional view schematically showing an outline of one example of a configuration of an ultraviolet light emitting device according to the present invention.

An embodiment of an ultraviolet light emitting device according to the present invention (hereinafter, appropriately referred to as the "the present invention device") will be described with reference to the drawings. In the drawings that are used in the following descriptions, the substance of the invention is schematically shown while the principal part is emphasized for easy understanding of the descriptions, and therefore the dimensional ratio of each part is not always identical to that of the actual device. Hereinafter, the present invention will be described based on the assumption that an ultraviolet light emitting element used for the present invention device is an ultraviolet light emitting diode formed of a nitride semiconductor.

Figure 2A:
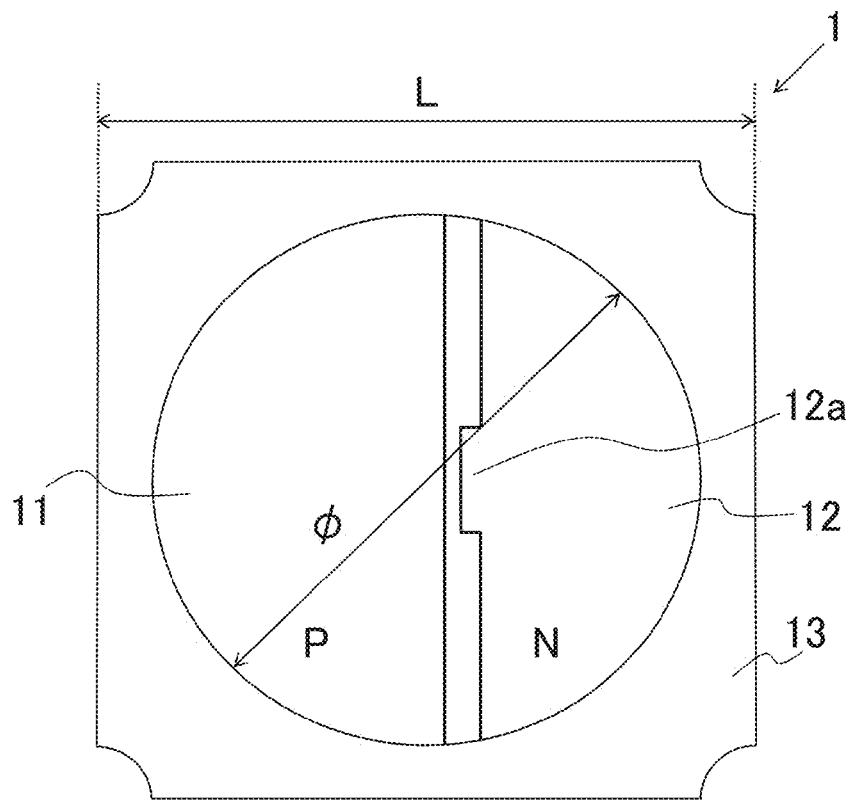
FIG. 2 is a set of plan view and sectional view showing a plane shape and a cross-sectional shape, respectively, of a sub-mount shown in FIG. 1.
Figure 2B:
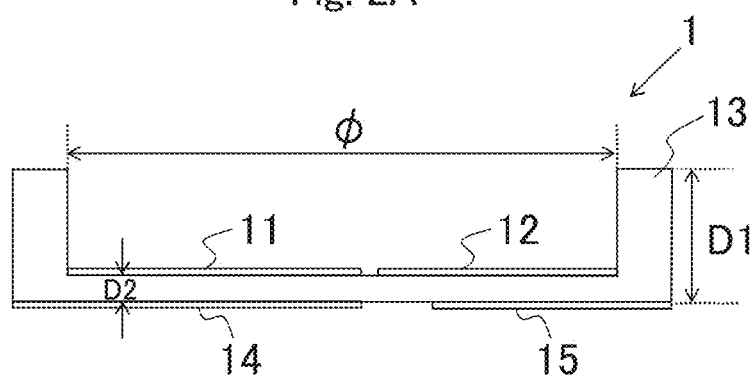

FIG. 1 is a sectional view schematically showing an outline of one example of a configuration of the present invention device in which an ultraviolet light emitting element 2 is placed on a sub-mount 1. FIG. 2 is a plan view (A) showing a plane shape of the sub-mount 1 (corresponding to a base) and a sectional view (B) showing a cross-sectional shape of the sub-mount 1. The sub-mount 1 is configured such that first metal electrode wiring 11 on the anode side and second metal electrode wiring 12 on the cathode side are each formed on a part of a surface of a substrate 10 formed of an insulating material, a thickness D1 of a side wall portion 13 of the substrate 10 is larger than a thickness D2 of a central portion at the inside from the side wall portion 13, and a sealing resin 3 for sealing the ultraviolet light emitting element 2 can be stored in a space surrounded by the side wall portion 13. Further, a light condensing lens 4 formed of hemispheric quartz glass transparent to ultraviolet light emitted from the ultraviolet light emitting element 2 is fixed on the upper surface of the side wall portion 13. The sealing resin 3 is covered with the lens 4 and thereby fixed in the space surrounded by the side wall portion 13. The first and second metal electrode wirings 11 and 12 are connected to lead terminals 14 and 15 provided on the rear surface side of the substrate 10 through a through-electrode (not illustrated) provided on the substrate 10 at the central portion. When the sub-mount 1 is placed on another printed board etc., an electrical connection is formed between metal wiring on the printed board and the lead terminals 14 and 15. The ultraviolet light transparency characteristic of the lens 4 should match the light emission wavelength of the ultraviolet light emitting element 2 that is used. The lens 4 may be not only made of quartz glass, but also formed by, for example, shaping the surface of the sealing resin 3 into a light condensing curved surface such as a spherical surface. Further, the lens 4 may be not only a light condensing lens, but also a light scattering lens depending on a use purpose, or is not necessarily required to be provided.

As shown in FIG. 2, the first and second metal electrode wirings 11 and 12 are formed so as to be exposed at the surface of the central portion of the substrate 10 surrounded by the side wall portion 13, disposed separately from each other, and electrically isolated from each other. The second metal electrode wiring 12 has a projected portion 12a protruding to the first metal electrode wiring 11 side near the center of the central portion, and the distance between the projected portion 12a and the first metal electrode wiring 11 is narrowed. The ultraviolet light emitting element 2 is placed and fixed on the first and second metal electrode wirings 11 and 12 straddling the gap of the narrowed distance between the wirings such that the surface, on which pad electrodes 16 and 17 are formed, is turned downward, and the pad electrodes 16 and 17 and the first and second metal electrode wirings 11 and 12 face each other and electrically and physically connected to each other through a metallic bump material 5. In this embodiment, the ultraviolet light emitting element 2 is mounted on the sub-mount 1 by so called flip chip mounting. A gap 18 held between the sub-mount 1 and the ultraviolet light emitting element 2 on the periphery of the bump material 5 is also filled with the sealing resin 3.

In this embodiment, the substrate 10 of the sub-mount 1 is formed of a ceramic such as alumina ($Al_2O_3$), and the metal that forms the first and second metal electrode wirings 11 and 12 is gold (Au).

Figure 3A:
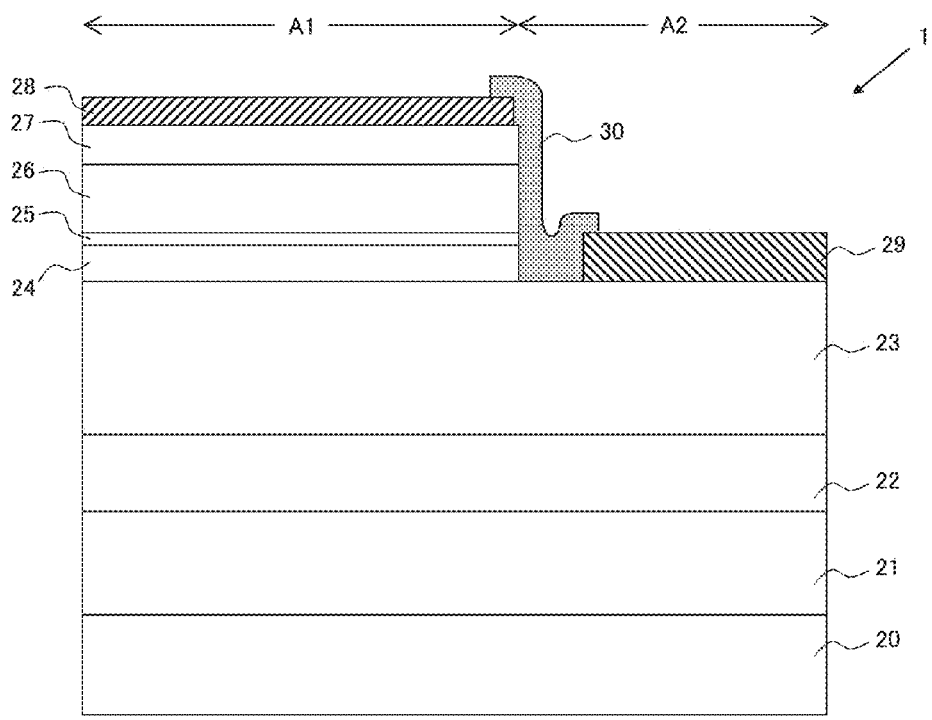
FIG. 3 is a set of sectional view and plan view schematically showing a cross-sectional structure of a principal part and a plane shape of a whole chip, respectively, of an ultraviolet light emitting element shown in FIG. 1.
Figure 3B:
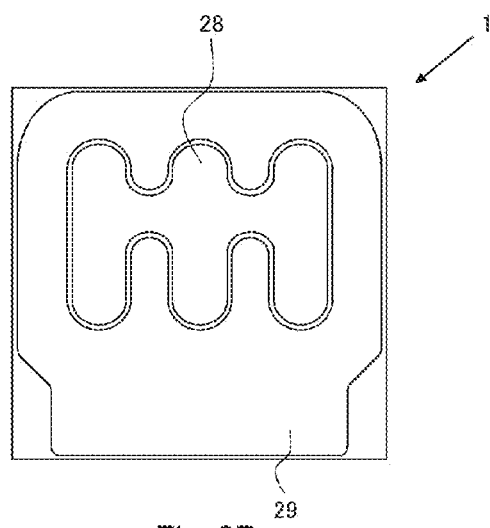
Figure 4A:
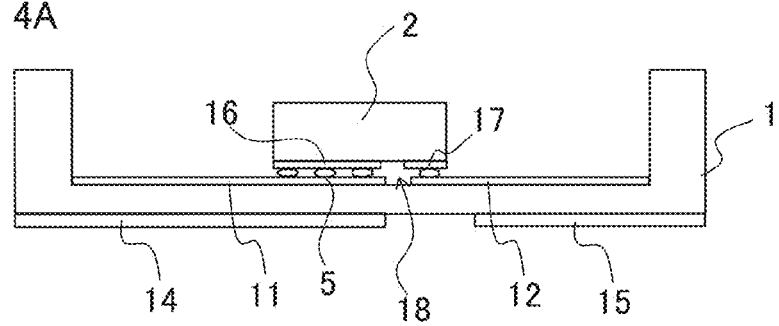
FIG. 4 is a set of process sectional views each schematically showing an outlined process of a method for producing an ultraviolet light emitting device according to the present invention.
Figure 4B:
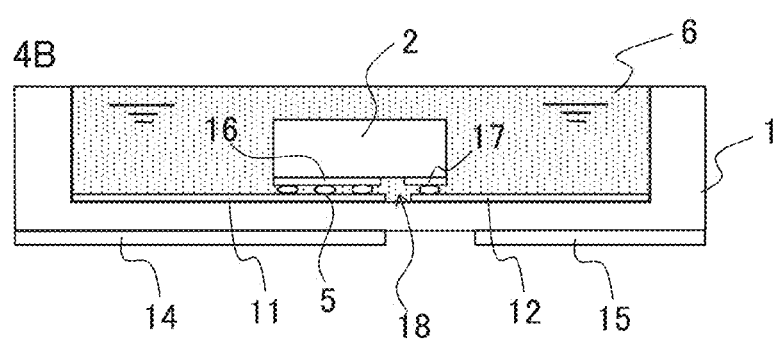
Figure 4C:
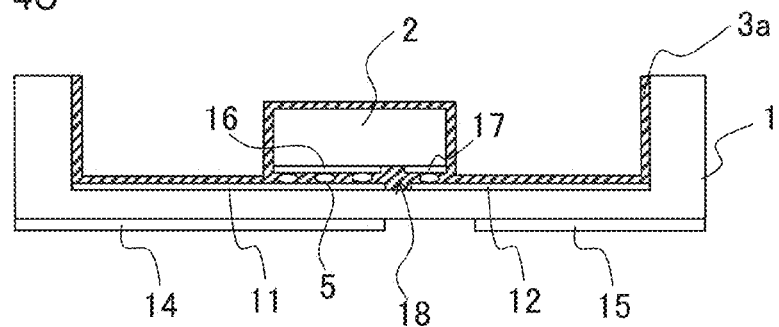
Figure 4D:
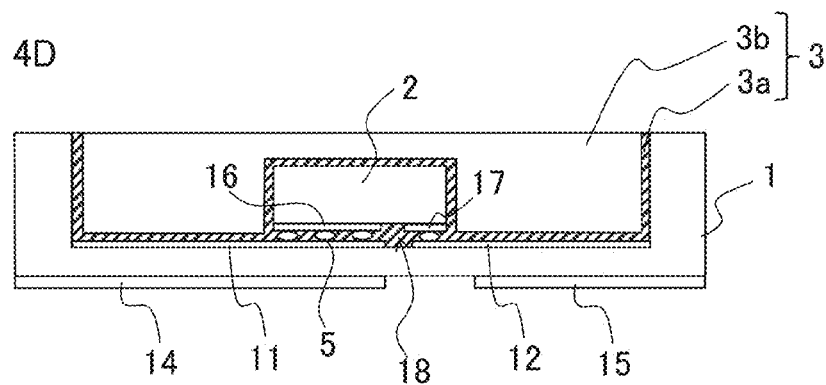

As shown in FIG. 3, the ultraviolet light emitting element 2 has a laminated structure in which a substrate with an AlN layer 21 and an AlGaN layer 22 grown on a sapphire (0001) substrate 20 is used as a template, and on the template, an n-type clad layer 23 formed of an n-type AlGaN, an active layer 24 formed of AlGaN having a single or multi-layer quantum-well-structure, an electron blocking layer 25 of p-type AlGaN having an Al molar fraction higher than that of the active layer 24, a p-type clad layer 26 of p-type AlGaN and a p-type contact layer 27 of p-type GaN are laminated in order. A part of a laminated structure including the active layer 24, the electron blocking layer 25, the p-type clad layer 26 and the p-type contact layer 27 that are situated above the n-type clad layer 23 is removed by reactive ion etching etc. until the surface of the n-type clad layer 23 is partially exposed, and a laminated structure including layers of from the active layer 24 to the p-type contact layer 27 is formed on a first region (A1) on the n-type clad layer 23. The surface of the n-type clad layer 23 is exposed at a second region (A2) that is different from the first region (A1).

For example a p-electrode 28 of ITO/Ni/Au is formed on the surface of the p-type contact layer 27, and for example an n-electrode 29 of Ti/Al/Ti/Au is formed on the exposed surface of the n-type clad layer 23 within the second region (A2). In this embodiment, Au at the uppermost layer of the p-electrode 28 forms the pad electrode 16 on the anode side, and Au at the uppermost layer of the n-electrode 29 forms the pad electrode 17 on the cathode side. The exposed surface between the p-type electrode 28 and the n-electrode 29 is covered with a protective insulating film 30 of $SiO_2$ etc.

In this embodiment, the bump material 5 that connects the pad electrodes 16 and 17 and the first and second metal electrode wirings 11 and 12 is gold (Au) which is the same as the material of the pad electrodes 16 and 17 and the first and second metal electrode wirings 11 and 12.

In this embodiment, the ultraviolet light emitting element 2 is intended to output ultraviolet light having a center emission wavelength of 290 nm or more, preferably 300 nm or more. The center emission wavelength is adjusted by the AlN molar fraction in the active layer 24, and the upper limit of the center emission wavelength here is about 365 nm when the active layer 24 is composed of GaN (AlN molar fraction is 0%). When to AlGaN that forms the active layer 24, In is added to produce band gap energy (about 3.4 eV) equal to that of GaN, an equivalent center emission wavelength of about 365 nm is obtained. When to AlGaN that forms the active layer 24, In is added instead of Al or in addition to Al to form InGaN or InAlOaN, a center emission wavelength of 365 nm or more can be obtained.

In this embodiment, an amorphous fluororesin is used as the sealing resin 3. Particularly, as a part of the sealing resin 3 (corresponding to a specific portion) that covers a portion (hereinafter, referred to as a "metal-exposed portion") at which metals of the first and second metal electrode wirings 11 and 12, the pad electrodes 16 and 17 and the bump material 5 etc. are exposed, the first type amorphous fluororesin described below is used. The first type amorphous fluororesin is an amorphous fluororesin composed of a polymer or a copolymer having a reactive terminal functional group bondable to the above-mentioned metals. More specifically, the first type amorphous fluororesin is an amorphous fluororesin in which a structural unit that forms a polymer or a copolymer has a fluorine-containing aliphatic cyclic structure, and the reactive terminal functional group is a carboxyl group (COOH) or an ester group (COOR). R represents an alkyl group.

Preferable as a structural unit having a fluorine-containing aliphatic cyclic structure are units based on a cyclic fluorine-containing monomer (hereinafter referred to as "unit A") or units formed by cyclopolymerization of diene fluorine-containing monomers (hereinafter referred to as "unit B").

The monomer of unit A is a monomer having a polymerizable double bond between carbon atoms constituting the fluorine-containing aliphatic ring or a monomer having a polymerizable double bond between a carbon atom constituting the fluorine-containing aliphatic ring and a carbon atom that is not contained in the fluorine-containing aliphatic ring. Preferable as the monomer of unit A is a compound (1) or compound (2) shown in the following formulas 1 and 2, respectively.

[Formula 1]

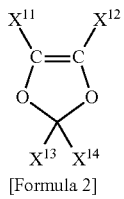

(1)

[Formula 2]

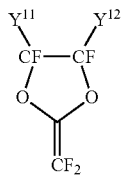

(2)

$X^{11}$, $X^{12}$, $X^{13}$ and $X^{14}$ in the formula 1, and $Y^{11}$ and $Y^{12}$ in the formula 2 are fluorine atom, perfluoroalkyl group, or perfluoroalkoxy group independently of one another. As the perfluoroalkyl group in $X^{11}$, $X^{12}$, $X^{13}$, $X^{14}$, $Y^{11}$ and $Y^{12}$, the carbon number preferably ranges from 1 to 7, and more preferably, from 1 to 4.

The perfluoroalkyl group is preferably linear or branched, and more preferably, linear. More specifically, examples thereof are a trifluoromethyl group, pentafluoroethyl group and heptafluoropropyl group, and a trifluoromethyl group is particularly preferable. As the perfluoroalkoxy group in $X^{11}$, $X^{12}$, $X^{13}$, $X^{14}$, $Y^{11}$ and $Y^{12}$, examples thereof are that an oxygen atom (—O—) is bound to the perfluoroalkoxy group.

A fluorine atom is preferable as $X^{11}$, $X^{12}$ is preferably a fluorine atom, trifluoromethyl group, or perfluoroalkoxy group with the carbon number ranging from 1 to 4, and more preferably, a fluorine atom or trifluoromethoxy group. $X^{13}$ and $X^{14}$ are preferably a fluorine atom or perfluoroalkyl group with the carbon number ranging from 1 to 4, and more preferably, a fluorine atom or trifluoromethyl group, independently of each other.

$Y^{11}$ and $Y^{12}$ are preferably a fluorine atom, perfluoroalkyl group with the carbon number ranging from 1 to 4, perfluoroalkoxy group with the carbon number ranging from 1 to 4, and more preferably, a fluorine atom or trifluoromethyl group, independently of each other.

In compound (1), $X^{13}$ and $X^{14}$ may be bound mutually to form the fluorine-containing aliphatic ring together with carbon atoms of bound $X^{13}$ and $X^{14}$. The fluorine-containing aliphatic ring is preferably a four-to-six membered ring. The fluorine-containing aliphatic ring is preferably a saturated aliphatic ring. The fluorine-containing aliphatic ring may have an ethereal oxygen atom (—O—) in the ring. In this case, the number of ethereal oxygen atoms in the fluorine-containing aliphatic ring is preferably 1 or 2. Preferable specific examples of compound (1) include compounds (1-1) to (1-5) shown in the following formulas 3-7, respectively.

[Formula 3]

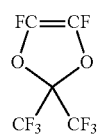

(1-1)

[Formula 4]

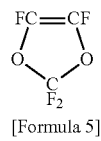

(1-2)

[Formula 5]

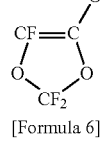

(1-3)

[Formula 6]

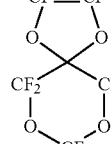

(1-4)

[Formula 7]

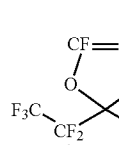

(1-5)

In compound (2), $Y^{11}$ and $Y^{12}$ may be bound mutually to form the fluorine-containing aliphatic ring together with carbon atoms of bound Y" and $Y^{12}$. The fluorine-containing aliphatic ring is preferably a four-to-six membered ring. The fluorine-containing aliphatic ring is preferably a saturated aliphatic ring. The fluorine-containing aliphatic ring may have an ethereal oxygen atom (—O—) in the ring. In this case, the number of ethereal oxygen atoms in the fluorine-containing aliphatic ring is preferably 1 or 2. Preferable specific examples of compound (2) include compounds (2-1) to (2-2) shown in the following formulas 8-9, respectively.

[Formula 8]

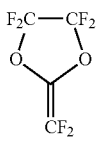
(2-1)

[Formula 9]

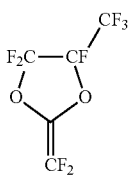
(2-2)

The first type amorphous fluororesin may be a homopolymer of the above-mentioned monomer of unit A, or a copolymer of the monomer of unit A and another monomer except such a monomer. In addition, in the copolymer, a rate of the monomer of unit A relative to the total of all the repetitive units constituting the copolymer is preferably 20 mole % or more, more preferably 40 mole % or more, and can be 100 mole %. The another monomer is not limited particularly, as long as the monomer can be copolymerized with the monomer of unit A. More specifically, examples thereof are a diene fluorine-containing monomer described below, tetrafluoroethylene, chlorotrifluoroethylene, perfluoro (methyl vinyl ether), perfluoro (ethyl vinyl ether), and perfluoro (propyl vinyl ether).

The diene fluorine-containing monomer forming the above-mentioned unit B by cyclopolymerization is a monomer having two polymerizable double bonds and fluorine atoms. The polymerizable double bond is not limited particularly, and is preferably a vinyl group, allyl group, acryloyl group and methacryloyl group. As the diene fluorine-containing monomer, the following compound (3) is preferable.

$$CF_2=CF-Q-CF=CF_2 \quad (3)$$

In the formula, Q may have an ethereal oxygen atom, and is a perfluoro alkylene group with the carbon number ranging from 1 to 3 such that a part of fluorine atoms can be replaced with halogen atoms except the fluorine atom. Examples of the halogen atom except the fluorine atom are a chlorine atom and bromine atom. When Q is a perfluoro alkylene group having ethereal oxygen atoms, the ethereal oxygen atoms in the perfluoro alkylene group may exist at one terminal of the group, at both terminals of the group, or between carbon atoms of the group. From the viewpoint of cyclopolymerization, the oxygen atoms preferably exist at one terminal. As a unit B formed by cyclopolymerization of compound (3), examples thereof are repetition units of units (3-1) to (3-4) shown in the following formulas 10-13.

[Formula 10]

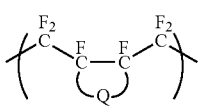
(3-1)

[Formula 11]

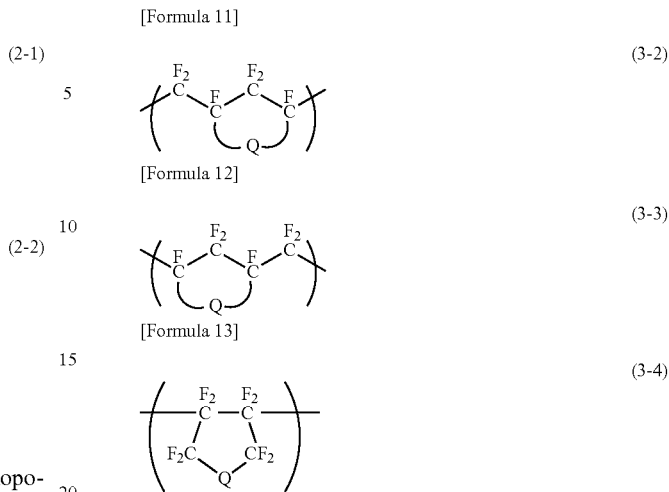
(3-2)

[Formula 12]

(3-3)

[Formula 13]

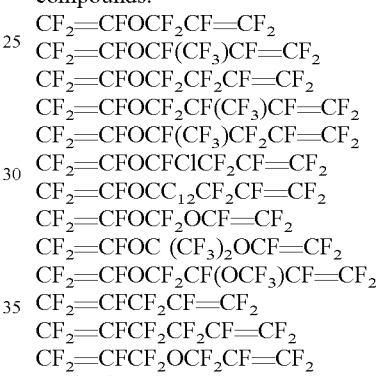
(3-4)

Specific examples of compound (3) include following compounds:
$CF_2=CFOCF_2CF=CF_2$
$CF_2=CFOCF(CF_3)CF=CF_2$
$CF_2=CFOCF_2CF_2CF=CF_2$
$CF_2=CFOCF_2CF(CF_3)CF=CF_2$
$CF_2=CFOCF(CF_3)CF_2CF=CF_2$
$CF_2=CFOCFClCF_2CF=CF_2$
$CF_2=CFOCC_{12}CF_2CF=CF_2$
$CF_2=CFOCF_2OCF=CF_2$
$CF_2=CFOC(CF_3)_2OCF=CF_2$
$CF_2=CFOCF_2CF(OCF_3)CF=CF_2$
$CF_2=CFCF_2CF=CF_2$
$CF_2=CFCF_2CF_2CF=CF_2$
$CF_2=CFCF_2OCF_2CF=CF_2$ The first type amorphous fluororesin may be comprised of polymer formed by only the above-mentioned unit B, or may be a copolymer having the unit B and other monomers except the unit B. In addition, in the copolymer, a rate of the unit B relative to the total of all the repetitive units constituting the copolymer is preferably 50 mole % or more, more preferably 80 mole % or more, and most preferably 100 mole %. The other monomer is not limited particularly, as long as the monomer can be copolymerized with the diene fluorine-containing monomer. More specifically, examples thereof are cyclic fluorine-containing monomers such as compound (1) and compound (2) as described previously, tetrafluoroethylene, chlorotrifluoroethylene, perfluoro (methyl vinyl ether), perfluoro(ethyl vinyl ether), and perfluoro(propyl vinyl ether).

The average molecular weight of the first type amorphous fluororesin ranges preferably from 3,000 to 1,000,000, more preferably, from 10,000 to 300,000, and further preferably, from 100,000 to 250,000. In addition, as a cyclopolymerization method, homopolymerization method, and copolymerization method of the above-mentioned monomers, for example, it is possible to apply conventional publicly known methods disclosed in Japanese Patent Application Publication No. H04-189880, etc.

As terminal functional groups of the amorphous fluororesin after the polymerization treatment, a plurality of unspecified functional groups other than COOH groups and COOR groups may be formed, and when using a known method disclosed in, for example, Japanese Patent Application Publication No. H04-189880 etc., the amorphous fluororesin after the polymerization treatment is heat-treated in, for example, air at 250° C. for 8 hours, and immersed in water or methanol to replace terminal functional groups of the amorphous fluororesin after the polymerization treatment by COOH groups or COOR groups, the first type amorphous fluororesin to be used in the present invention device is obtained.

One example of a commercial product of the first type amorphous fluororesin is CYTOP (produced by ASAHI GLASS Co., Ltd.). CYTOP, the terminal functional group of which is a COOH group, is a polymer of the unit B which is represented by the following chemical formula 14.

[Formula 14]

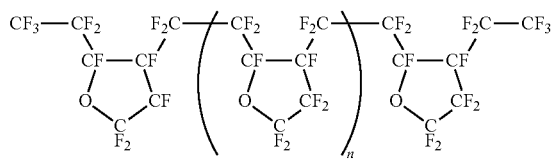

Next, an outline of a method for preparing the present invention device will be briefly described with reference to FIG. 4. First, as shown in FIG. 4 (A), a bare chip of the diced ultraviolet light emitting element 2 is fixed on the first and second metal electrode wirings 11 and 12 of the sub-mount 1 by well known flip chip mounting using the bump material 5 (step 1). Specifically, the pad electrode 16 and the first metal electrode wiring 11 are physically and electrically connected to each other with the bump material 5 interposed therebetween, and the pad electrode 17 and the second metal electrode wiring 12 are physically and electrically connected to each other with the bump material 5 interposed therebetween. Consequently, the p-electrode 28 of the ultraviolet light emitting element 2 and the first metal electrode wiring 11 are electrically connected to each other, and the n-electrode 29 of the ultraviolet light emitting element 2 and the second metal electrode wiring 12 are electrically connected to each other.

Next, as shown in FIG. 4 (B), a coating solution 6 obtained by dissolving the first type amorphous fluororesin in a fluorine-containing solvent, preferably an aprotic fluorine-containing solvent is injected into a space surrounded by the side wall portion 13 of the sub-mount 1 using a Teflon needle etc. having good releasability. Thereafter, as shown in FIG. 4 (C), the coating solution 6 is gradually heated to volatilize the solvent, so that a resin film 3a of the first type amorphous fluororesin is formed on the inner wall surface of the side wall portion 13 of the sub-mount 1, the upper surfaces of the first and second metal electrode wirings 11 and 12, the exposed surface of the substrate 10 between the first and second metal electrode wirings 11 and 12, and the upper surface and side surface of the ultraviolet light emitting element 2, and in the gap 18 between the lower surface side of the ultraviolet light emitting element 2 and the upper surface of the sub-mount 1 (step 2). In volatilization of the solvent in step 2, it is important to gradually heat the coating solution from a low-temperature range including and below the boiling point of the solvent (e.g. around room temperature) to a high-temperature range including and above the boiling point of the solvent (e.g. around 200° C.) to volatilize the solvent so that bubbles do not remain in the resin film 3a.

Next, as shown in FIG. 4 (D), the solid first type amorphous fluororesin is put in a space inside and above the resin film 3a, which is formed in step 2, in the space surrounded by the side wall portion 13 of the sub-mount 1, and the first type amorphous fluororesin is melted at a high temperature of, for example, 250° C. to 300° C., and then gradually cooled to mold a resin film 3b (step 3).

Finally, the lens 4 is fixed to the upper surface of the side wall portion 13 (step 4), so that the present invention device shown in FIG. 1 is prepared. In the preparation method illustrated in FIG. 4, the sealing resin 3 includes the resin film 3a and the resin film 3b. The lens 4 is fixed to the upper surface of the side wall portion 13 by an adhesive as disclosed in, for example, Patent Document 1, or fixed to the upper surface of the side wall portion 13 by a fitting structure provided on the lens 4 and the side wall portion 13. The method for fixing the lens 4 is not limited to the illustrated method.

The molecular weight of the fluorine-containing solvent used in step 2 being excessively high results in not only increases in the viscosity of the coating solution 6, but also decreases in the solubility of the first type amorphous fluororesin, and therefore, the molecular weight of the fluorine-containing solvent is preferably 1000 or less. Further, to increase the solubility of the first type amorphous fluororesin, the fluorine content of the solvent is preferably in the range of 60 percent to 80 percent by weight.

Examples of the aprotic fluorine-containing solvent are polyfluoro aromatic compound, polyfluoro trialkyl amine, polyfluoro alkane, polyfluoro cyclic ether and hydro fluoro ether (HFE). These aprotic fluorine-containing solvents may be used alone, or in combination of two or more kinds.

Examples of the polyfluoro aromatic compound include perfluorobenzene, pentafluorobenzene, 1,3-bis(trifluoromethyl)benzene and 1,4-bis(trifluoromethyl)benzene. Examples of the polyfluoro trialkyl amine are perfluoro tributyl amine and perfluoro tripropyl amine. Examples of the polyfluoro cyclic ether include perfluoro(2-butyl tetrahydrofuran).

Examples of the polyfluoro alkane are perfluoro hexane, perfluoro octane, perfluoro decane, perfluoro dodecane, perfluoro(2,7-dimethyloctane), 1,1,2-trichloro-1,2,2-trifluoroethane, 1,1,1-trichloro-2,2,2-trifluoroethane, 1,3-dichloro-1,1,2,2,3-pentafluoropropane, 1,1,1,3-tetrachloro-2,2,3,3-tetrafluoropropane, 1,1,3,4-tetrachloro-1,2,2,3,4,4-hexafluorobutane, perfluoro(1,2-dimethylhexane), perfluoro (1,3-dimethylhexane), perfluoro cyclohexane, perfluoro(1,3,5-trimethylcyclohexane), 2H, 3H-perfluoropentane, 1H-perfluorohexane, 1H-perfluorooctane, 1H-perfluorodecane, 1H,1H,1H,2H,2H-perfluorohexane, 1H,1H,1H,2H,2H-perfluorooctane, 1H,1H,1H,2H,2H-perfluorodecane 3H,4H-perfluoro-2-methylpentane, 2H,3H-perfluoro-2-methylpentane, 1H-1,1-dichloro perfluoropropane and 1H-1,3-dichloro perfluoropropane.

The hydro fluoro ether (HFE) is preferably an HFE represented by general formula $R^1$—O—$R^2$ ($R^1$ is a linear or branched polyfluoro alkyl group with the carbon number ranging from 5 to 12 that may have an ether bond, and $R^2$ is a linear or branched alkyl group with the carbon number ranging from 1 to 5.) When the carbon number of $R^1$ is 4 or less, it is hard to dissolve the fluorine-containing polymer, and since the $R^1$ with the carbon number being 13 or more is hard to commercially get, the carbon number of $R^1$ is selected from the range of 5 to 12. The carbon number of $R^1$ preferably ranges from 6 to 10, and more preferably, from 6 to 7 and from 9 to 10. The polyfluoro alkyl group is a group where two or more hydrogen atoms of the alkyl group are replaced with fluorine atoms, and includes perfluoro alkyl groups where all the hydrogen atoms of the alkyl group are replaced with fluorine atoms, and groups where two or more hydrogen atoms of the alkyl group are replaced with fluorine atoms while one or more hydrogen atoms of the alkyl group are replaced with halogen atoms except the fluorine atom. The halogen atom except the fluorine atom is preferably a chlorine atom.

The polyfluoro alkyl group is preferably a group where 60% or more of the number of hydrogen atoms of a corresponding alkyl group are replaced with fluorine atoms, and more preferably, a group where 80% or more of such a number are replaced with fluorine atoms. The polyfluoro alkyl group is further preferably a perfluoro alkyl group. In the case of $R^1$ having an ether bond, since the solubility is inhibited when the number of ether bonds is too high, the number of ether bonds in the $R^1$ preferably ranges from 1 to 3, and more preferably, 1 or 2. When the carbon number of $R^2$ is 6 or more, the solubility of the polymer containing the fluorine-containing cyclic structure is extremely inhibited. Preferable examples of $R^2$ are a methyl group or ethyl group.

Examples of the HFE are $F(CF_2)_5OCH_3$, $F(CF_2)_6OCH_3$, $F(CF_2)_7OCH_3$, $F(CF_2)_8OCH_3$, $F(CF_2)_9OCH_3$, $F(CF_2)_{10}OCH_3$, $H(CF_2)_6OCH_3$, $(CF_3)_2CF(OCH_3)CFCF_2CF_3$, $F(CF_2)_3OCF(CF_3)CF_2OCH_3$, $F(CF_2)_3OCF(CF_3)CF_2OCF(CF_3)CF_2OCH_3$, $F(CF_2)_8OCH_2CH_2CH_3$, $(CF_3)_2CFCF_2CF_2OCH_3$, and $F(CF_2)_2O(CF_2)_4OCH_2CH_3$. As the HFE, $(CF_3)_2CF(OCH_3)CFCF_2CF_3$ is particularly suitable. In addition, among the fluorine-containing solvents except the above-mentioned solvents are fluorine-containing polyethers of low molecular weights, etc.

In the above descriptions, a case where injection of the coating solution 6 and volatilization of the solvent in step 2 are each performed one time, but the resin film 3a may be formed by repeating injection of the coating solution 6 and volatilization of the solvent multiple times.

In the preparation method illustrated in FIG. 4, the resin film 3b is formed by melt molding in step 3, but the resin film 3b may be formed by repeatedly carrying out a method in which the coating solution 6 similar to that in step 2, and a solvent is volatilized.

The amorphous fluororesin used for the resin film 3b may be the first type amorphous fluororesin used for the resin film 3a, or may be a second type amorphous fluororesin formed of a polymer or copolymer having a nonreactive terminal functional group which is not bondable to metals that form the first and second metal electrode wirings 11 and 12, the pad electrodes 16 and 17 and the bump material 5. As the structural unit that forms the polymer or copolymer in the second type amorphous fluororesin, one identical to the structural unit of the first type amorphous fluororesin can be used. The nonreactive terminal functional group of the second type amorphous fluororesin is a perfluoroalkyl group such as $CF_3$. Further, examples of the reactive terminal functional group of the first type amorphous fluororesin to be used in the resin film 3b include a $NH_2$ group, $Si(OR)_n$ group, a COF group, a $SiCl_3$ group, a N=C=O group, an OH group, a $CF=CF_2$ group, an OR group and $CF_2H$ group in addition to a COOH group and a COOR group. R represents an alkyl group.

The present invention device is characterized in that as a part of the sealing resin 3 covering the metal-exposed portion (resin film 3a in the example shown in FIG. 4), the first type amorphous fluororesin composed of a polymer or a copolymer having as a terminal functional group a reactive functional group bondable to the metals is used, and the wavelength at the short-wavelength edge of the light emission wavelength range in an ultraviolet light emitting element including an AlGaN-based semiconductor layer exists on a longer-wavelength side as compared to the long-wavelength edge of the absorption wavelength range in the first type amorphous fluororesin. Examples shown below are intended to use, as the first type amorphous fluororesin, one having as a terminal functional group a COOH group in which the long-wavelength edge of the absorption wavelength range exists in the vicinity of 260 to 280 nm, and one having as a terminal functional group a COOR group in which the long-wavelength edge of the absorption wavelength range exists in the vicinity of 255 to 275 nm. In this embodiment, the light emission wavelength range in the ultraviolet light emitting element is defined as a light emission wavelength range where the light emission spectral intensity is 1% or more of the peak value (maximum value). For the light emission spectral intensity of the ultraviolet light emitting element, one measured as a spectral irradiance (unit: $W/m^3$) is used.

The relationship between the short-wavelength edge and center emission wavelength of the light emission wavelength range in the ultraviolet light emitting element and the long-wavelength edge of the absorption wavelength range in the amorphous fluororesin, and the experimental results of verifying the effect obtained by adjusting the short-wavelength edge of the light emission wavelength range in the ultraviolet light emitting element so as to be positioned on a longer-wavelength side as compared to the long-wavelength edge of the absorption wavelength range in the amorphous fluororesin in examples using the first type amorphous fluororesin in the resin film 3a covering the metal-exposed portion will now be described.

Figure 5:
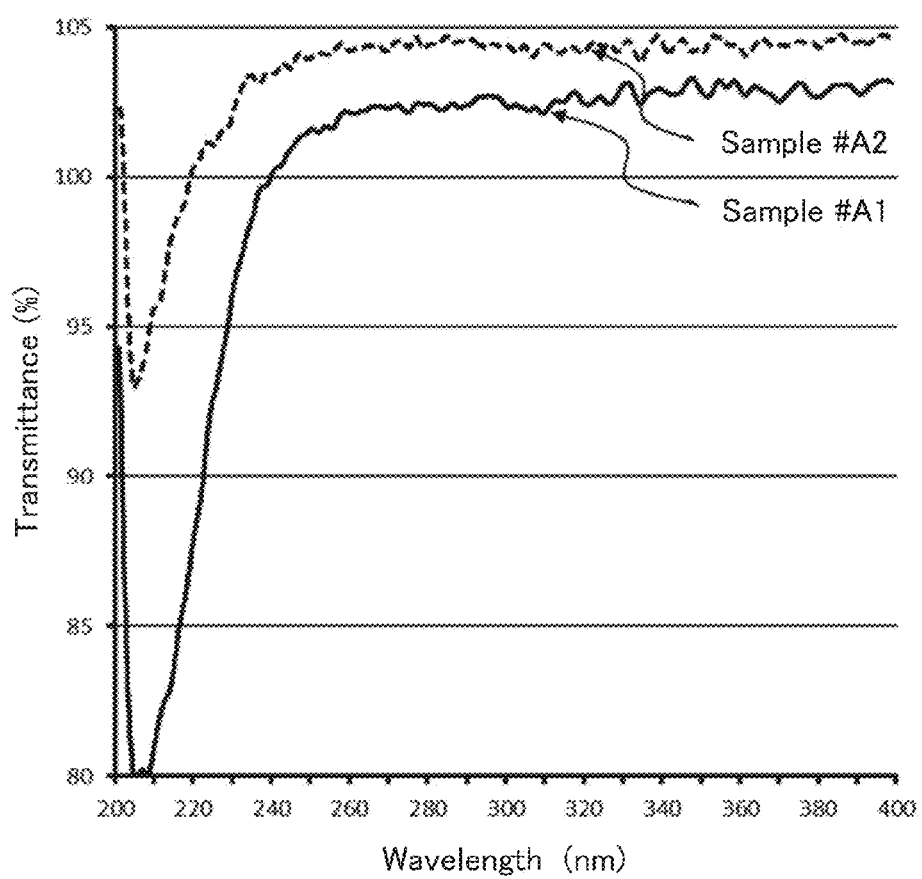
FIG. 5 is a characteristic diagram showing one example of a wavelength dependency of an ultraviolet transmittance of a first type amorphous fluororesin (type A resin) having a COOH group as a terminal functional group.
Figure 6:
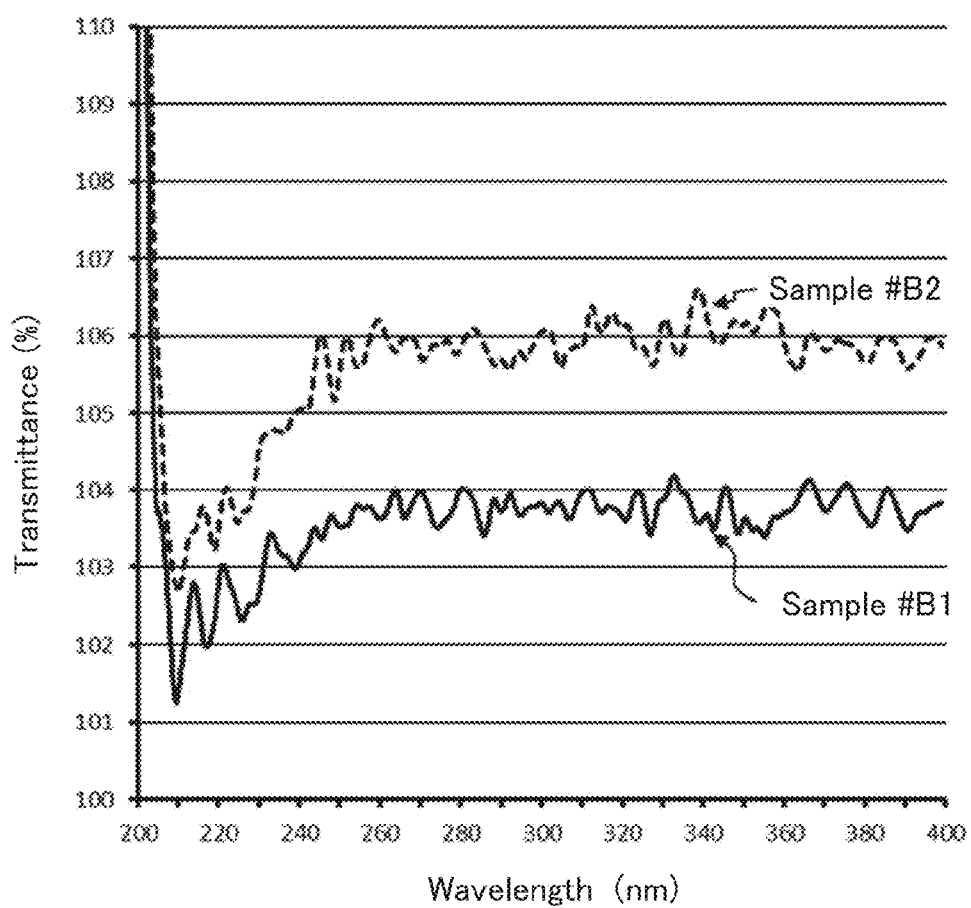
FIG. 6 is a characteristic diagram showing one example of a wavelength dependency of an ultraviolet transmittance of a first type amorphous fluororesin (type B resin) having a COOH group as a terminal functional group.
Figure 7:
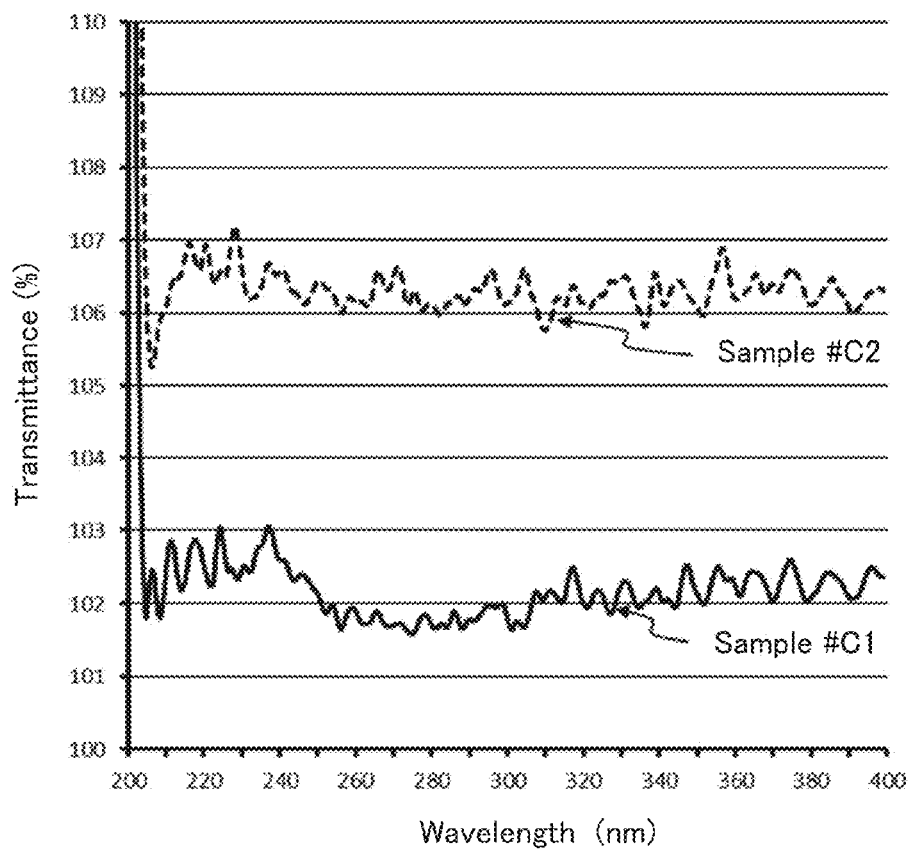
FIG. 7 is a characteristic diagram showing one example of a wavelength dependency of an ultraviolet transmittance of a second type amorphous fluororesin (type C resin) having a $CF_3$ as a terminal functional group.

First, for two first type amorphous fluororesins which are each used in the present invention device and which have reactive terminal groups: a COOH group and a COOR group, respectively, as terminal functional groups, and a second type amorphous fluororesin having a nonreactive terminal group: $CF_3$ as a terminal functional group as a comparative example, the results of measuring the ultraviolet transmittances of the amorphous fluororesins for deriving the long-wavelength edge of the absorption wavelength range are shown in FIGS. 5 to 7. FIG. 5 shows the wavelength dependency of the ultraviolet transmittance for two samples #A1 and #A2 of the first type amorphous fluororesin having a COOH group as a terminal functional group (hereinafter, referred to as a "type A resin"), FIG. 6 shows the wavelength dependency of the ultraviolet transmittance for two samples #B1 and #B2 of the first type amorphous fluororesin having a COOR group as a terminal functional group (hereinafter, referred to as a "type B resin"), and FIG. 7 shows the wavelength dependency of the ultraviolet transmittance for two samples #C1 and #C2 of the second type amorphous fluororesin having $CF_3$ as a terminal functional group (hereinafter, referred to as a "type C resin").

For the transmittance of ultraviolet light, an amorphous fluororesin as a measuring object was formed on a sapphire substrate polished on both sides, and using a deuterium lamp (λ=200 nm to 360 nm) and a halogen lamp (λ=360 nm to 400 nm) as a light source, light having a specific wavelength was extracted by a spectroscope, and made incident to the amorphous fluororesin as a measuring object on the sapphire substrate, and the transmitted light was received by a detector, and signal-processed to output a light-receiving intensity as a digital value, so that spectral data of the light-receiving intensity was acquired. Similarly, light passing through a spectroscope was similarly made incident to a sapphire substrate before formation of an amorphous fluororesin as a measuring object, the light transmitted through the sapphire substrate was received, and signal-processed to output a light-receiving intensity as a digital value, so that spectral data of the light-receiving intensity was acquired. The former spectral data for the amorphous fluororesin was divided by the latter spectral data for the sapphire substrate to derive spectral data of the ultraviolet transmittance of each of the above-mentioned three amorphous fluororesins. The spectral data shown in each of FIGS. 5 to 7 includes plotted transmittances after the transmittances at measurement wavelengths in 0.2 nm increments are subjected to smoothing processing by calculating a moving average with a width of ±1 nm.

As shown in FIGS. 5 to 7, the derived transmittance exceeds 100% over the most part of the wavelength range of 200 nm to 400 nm, and this may be ascribable to a difference in properties (smoothness, roughness and so on) between the surface of the sapphire substrate used as a reference and the surface of the amorphous fluororesin as a measuring object formed on the sapphire substrate. The reason why the transmittance steeply increases on a shorter-wavelength side as compared to a wavelength in the vicinity of 204 nm may be that in this wavelength range, influences of absorption by oxygen in the air become significant, and therefore errors in the measurement data for the sapphire substrate and the amorphous fluororesin as a measuring object increase. Accordingly, in the spectral data in each of FIGS. 5 to 7, data at a wavelength of 210 nm or more is used. Since the transmittance derived in the manner described above exceeds 100% over the most part of the wavelength range of 200 nm to 400 nm as described above, the wavelength range where the transmittance is less than 100% cannot be defined as an absorption wavelength range in each amorphous fluororesin. The measured data in each of FIGS. 5 to 7 includes measurement errors, and therefore does not provide a spectral data in which the transmittance monotonously increases as the measurement wavelength shifts to a longer-wavelength side from a wavelength in the vicinity of 210 nm. Accordingly, it is difficult to identify the long-wavelength edge of the absorption wavelength range directly from the data. When the spectral data in each of FIGS. 5 and 6 is visually observed, it is presumed that the long-wavelength edge of the absorption wavelength range in the type A resin exists in the vicinity of 260 to 280 nm, and the long-wavelength edge of the absorption wavelength range in the type B resin exists in the vicinity of 255 to 275 nm. For the absorption wavelength range in the type C resin, identification from the spectral data in FIG. 7 is difficult, but it is presumed that the long-wavelength edge does not exist on a longer-wavelength side as compared to a wavelength in the vicinity of 220 nm. The above-mentioned presumption is supported by verification experiments on deterioration of electrical characteristics which is associated with an ultraviolet light emission operation of the later-described ultraviolet light emitting element and caused by a sealing resin.

Experimental results of verifying deterioration of electrical characteristics which is associated with an ultraviolet light emission operation and caused by terminal functional group of a sealing resin will now be described. The following fifteen samples #1 to #15 were provided as samples for the verification experiments. The sub-mount 1 used in each of the samples #1 to #15 was one in which the external dimension L of the side wall portion 13 shown in FIG. 2 (including notch portions at four corners) was 5 mm-square, the diameter φ of the circular space inside the side wall portion 13 was 4 mm, the thickness D1 of the side wall portion 13 was 1 mm, and the thickness D2 of the substrate at the central portion was 0.2 mm. The die size of the ultraviolet light emitting element 2 is 0.8 mm-square. The samples #1 to #15 were each soldered onto a printed board of 15 mm square, a forward voltage necessary for the light emission operation was applied between the p-electrode and the n-electrode of the ultraviolet light emitting element 2 placed on the sub-mount 1 through electrode terminals on the printed board. Nine bumps were formed for the pad electrode 16 on the p-electrode 28 side, and four bumps were formed for the pad electrode 17 on the n-electrode 29 side.

The samples #1 to #8 each include as the sealing resin 3 (resin film 3a) the type A resin having a reactive terminal group: a COOH group as a terminal functional group. The samples #9 and #10 each include as the sealing resin 3 (resin film 3a) the type B resin having a reactive terminal group: a COOR group as a terminal functional group. The samples #11 to #14 each include as the sealing resin 3 (resin film 3a) the type C resin having a nonreactive terminal group: $CF_3$ as a terminal functional group. The sample #15 does not include the sealing resin 3 (resin film 3a). In the samples #1 to #14, only the resin film 3a is formed, the resin film 3b is not formed, and the lens 4 is not attached. Each of the type A resin, the type B resin and the type C resin used in the samples #1 to #14 is CYTOP produced by ASAHI GLASS Co., Ltd.

Figure 9:
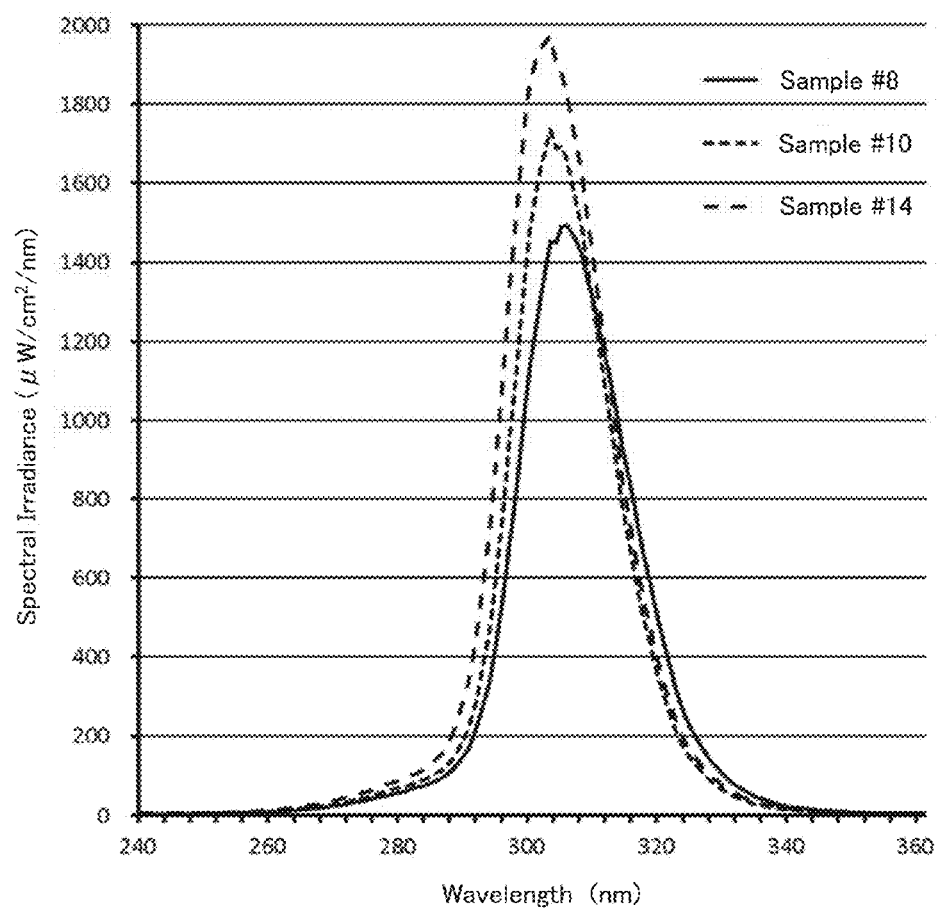
FIG. 9 is a light emission spectrum showing a light emission wavelength distribution before resin-sealing of an ultraviolet light emitting element mounted on each of samples #8, #10 and #14 used in verification experiments.

The center emission wavelength of the ultraviolet light emitting element 2 mounted in each of the samples #1 to #15 is distributed over the range of about 260 nm to about 307 nm. In this embodiment, the center emission wavelength of each sample is a central value in a wavelength range where the light emission spectral intensity is ½ (−3 dB) or more of the peak value (average value of the upper limit and the lower limit in the wavelength range). The center emission wavelength is approximately equal to the peak emission wavelength, and as shown in the list in FIG. 8. The full width at half maximum the light emission wavelength distribution of each sample is about 12 nm to 19 nm. As one example, the light emission wavelength distribution measured before resin-sealing of the ultraviolet light emitting element 2 mounted in each of the samples #8, #10 and #14 is shown in FIG. 9. The ordinate for the light emission wavelength distribution shown in FIG. 9 represents a spectral irradiance (unit: µW/cm2/nm).

In the light emission wavelength distribution for the sample #8, the center emission wavelength is about 306.7 nm, the full width at half maximum is about 19.0 nm, and the light emission wavelength range where the light emission spectral intensity is 1/100 (−20 dB) or more of the peak value is about 265.7 nm to 342.5 nm. In the light emission wavelength distribution for the sample #10, the center emission wavelength is about 304.8 nm, the full width at half maximum is about 17.3 nm, and the light emission wavelength range where the light emission spectral intensity is 1/100 (−20 dB) or more of the peak value is about 265.4 nm to 337.7 nm. In the light emission wavelength distribution for the sample #14, the center emission wavelength is about 304.0 nm, the full width at half maximum is about 17.8 nm, and the light emission wavelength range where the light emission spectral intensity is 1/100 (−20 dB) or more of the peak value is about 264.1 nm to 312.9 nm. In each light emission wavelength distribution shown in FIG. 9, the intervals between the short-wavelength edge (about 265.7 nm, about 265.4 nm and about 264.1 nm) and the center emission wavelength (about 306.7 nm, about 304.8 nm and about 304.0 nm) of the light emission wavelength range are about 40.9 nm, about 39.4 nm and about 39.2 nm, respectively.

The ratio of the total irradiance in the wavelength region on a shorter-wavelength side as compared to the short-wavelength edge to the total irradiance in the whole wavelength region in the light emission wavelength range is 0.77% for the sample #8, 0.73% for the sample #10 and 0.73% for the sample 14, and is thus substantially the same among the samples. Further, the short-wavelength edge of the light emission wavelength range where the light emission spectral intensity is 2/100 or more of the peak value, and the above-mentioned ratio are about 272.3 nm and 1.16% for the sample #8, about 271.6 nm and 1.18% for the sample #10 and about 270.4 nm and 1.21% for the sample #14, and are thus substantially the same among the samples. Further, the short-wavelength edge of the light emission wavelength range where the light emission spectral intensity is 3/100 or more of the peak value, and the above-mentioned ratio are about 276.7 nm and 1.79% for the sample #8, about 275.8 nm and 1.65% for the sample #10 and about 275.1 nm and 1.81% for the sample #14, and are thus substantially the same among the samples.

The thickness of the resin film 3a covering the metal-exposed portion in the samples #1 to #14 is about 30 μm at a thin portion. The height of the gap 18 held between the sub-mount 1 and the ultraviolet light emitting element 2 is smaller than this thickness, and the gap 18 is filled with any of the type A to type C amorphous fluororesins corresponding to the samples #1 to #14.

As a first verification experiment, the experimental samples #1 to #4, #11 and #15 were subjected to light emission output measurement in which a time-dependent change in light emission output was detected by continuously measuring a light emission output by a photodiode disposed so as to face the ultraviolet light emitting element while maintaining the light emitting operation state, and I-V characteristic measurement in which an I-V characteristic was measured at each of three time points: before resin sealing; after resin sealing and before the start of light emission; and after elapse of time appropriate to the sample after the start of light emission.

Figure 10:
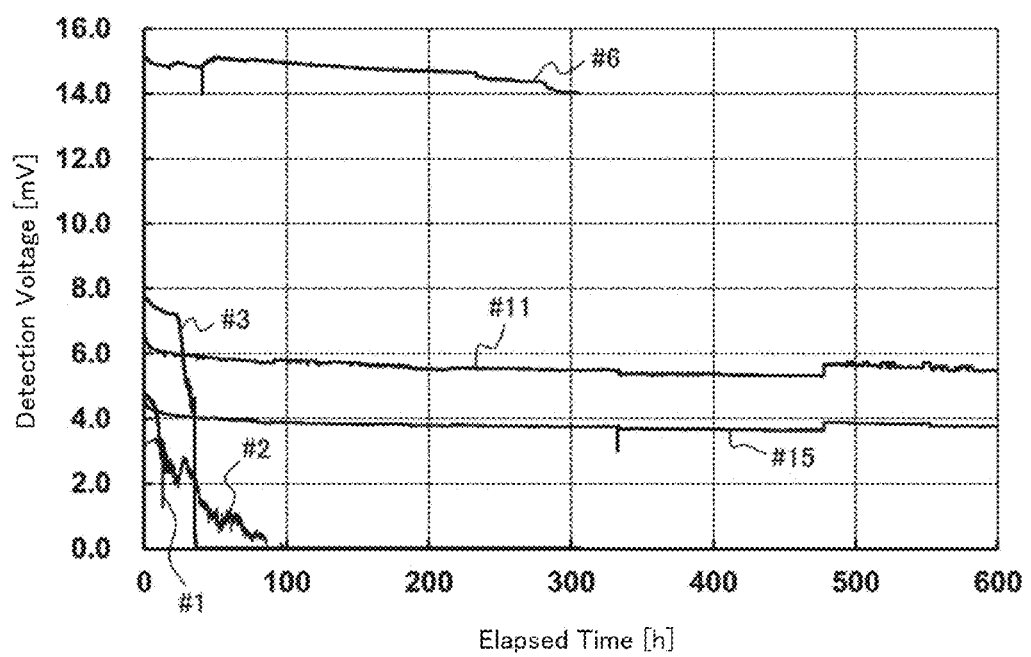
FIG. 10 is a view showing a time-dependent change in light emission output for samples #1 to #4, #11 and #15 used in the first verification experiment.

FIG. 10 shows a time-dependent change in light emission output for the samples #1 to #4, #11 and #15. In FIG. 10, the ordinate represents a detection voltage of the photodiode, and the abscissa represents an elapsed time. The forward current applied to each sample was 20 mA. From the measurement results shown in FIG. 10, it is apparent that in the samples #1 to #3 in which an ultraviolet light emitting element having a center emission wavelength of about 260 to 270 nm is resin-sealed with the type A resin, a defect occurs in which the light emission output rapidly decreases within 10 hours after the start of light emission. On the other hand, in the sample #4 in which an ultraviolet light emitting element having a center emission wavelength of about 290 nm is resin-sealed with the type A resin, the sample #11 in which an ultraviolet light emitting element having a center emission wavelength of about 260 nm is resin-sealed with the type C resin, and the sample #15 which is not resin-sealed, a rapid decrease in light emission output is not observed even after elapse of 300 hours after the start of light emission.

From the measurement results shown in FIG. 10, it is apparent that in the samples resin-sealed with the type A resin, a light emission output defect occurs with some cause when the center emission wavelength of the mounted ultraviolet light emitting element is 270 nm or less.

Next, I-V characteristics at the above-mentioned three time points for the samples #1 to #4 and #11 are shown in FIGS. 11 to 15. The voltage in the I-V characteristic shows a forward bias in positive polarity and a reverse bias in negative polarity, and the current shows an absolute value of the current value at each time of bias.

Figure 11A:
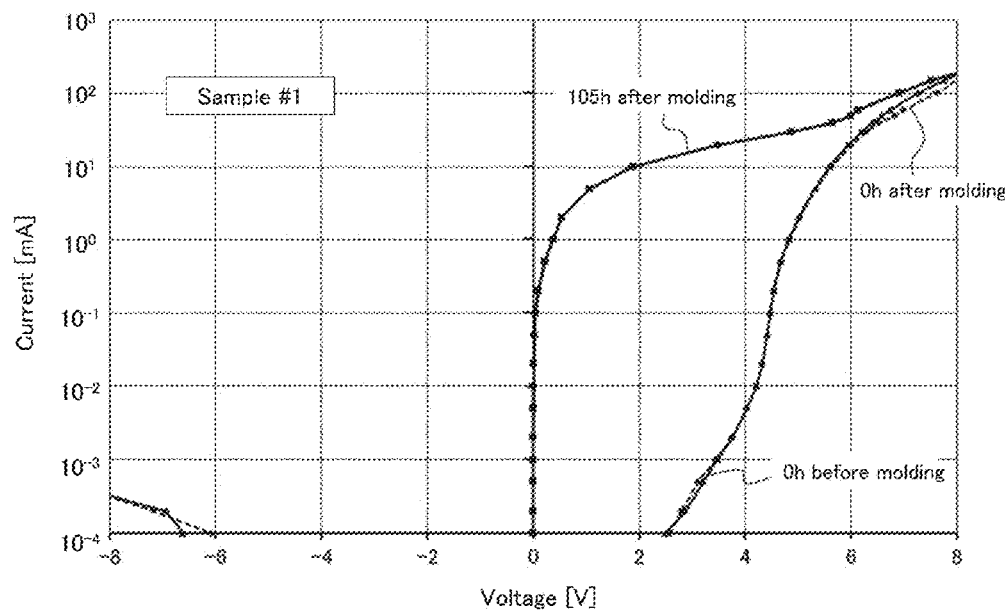
FIG. 11 is an I-V characteristic diagram for each elapsed time for the sample #1 used in the first verification experiment.
Figure 11B:
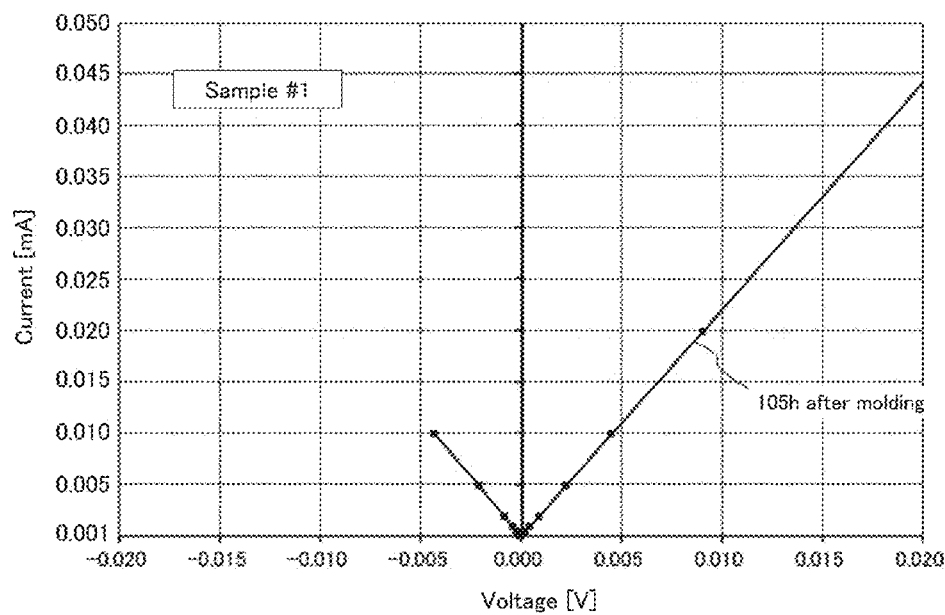
Figure 12A:
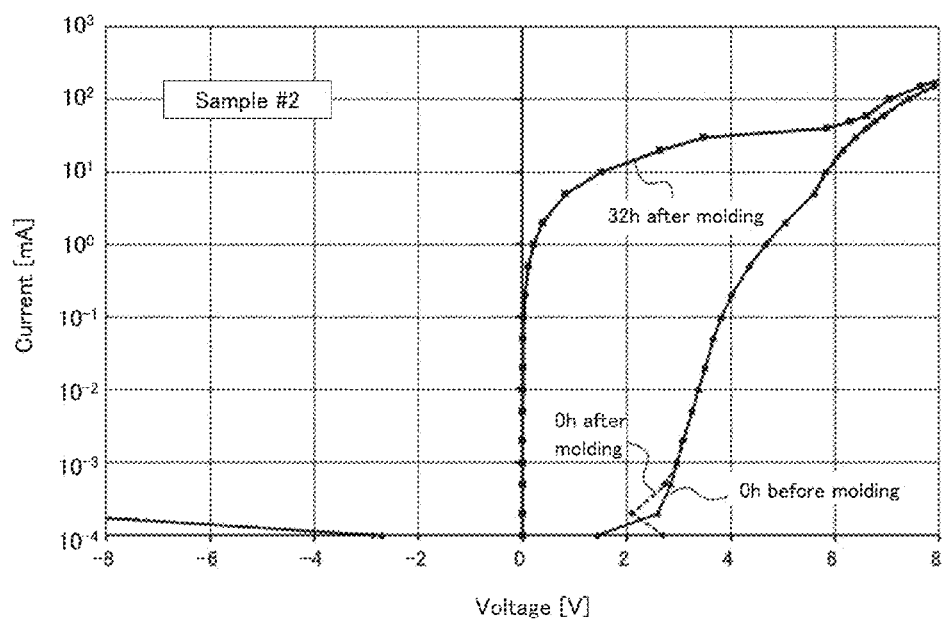
FIG. 12 is an I-V characteristic diagram for each elapsed time for the sample #2 used in the first verification experiment.
Figure 12B:
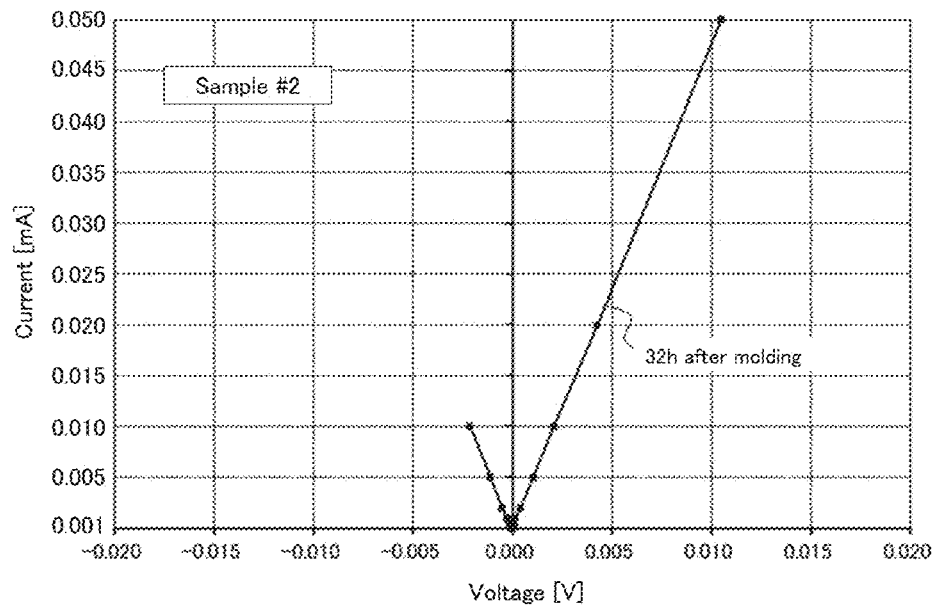
Figure 13A:
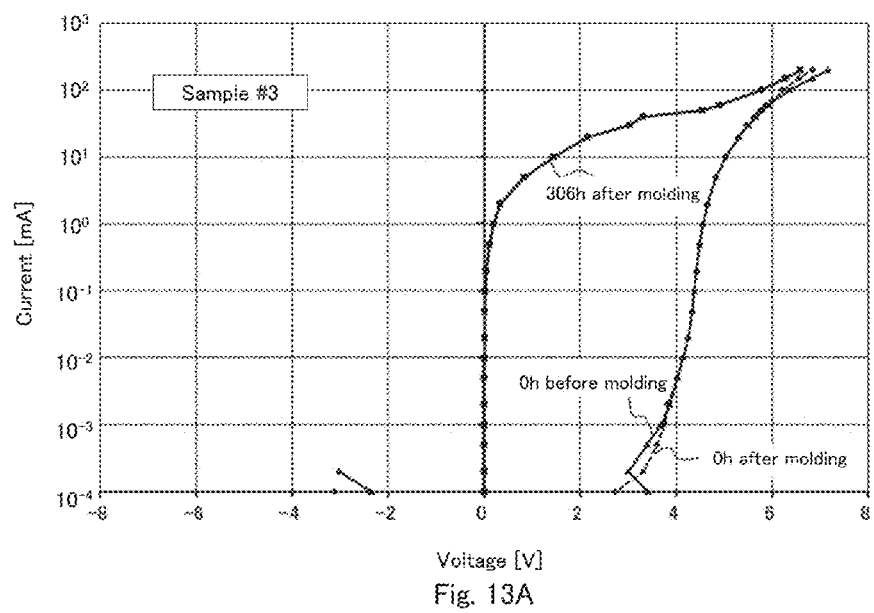
FIG. 13 is an I-V characteristic diagram for each elapsed time for the sample #3 used in the first verification experiment.
Figure 13B:
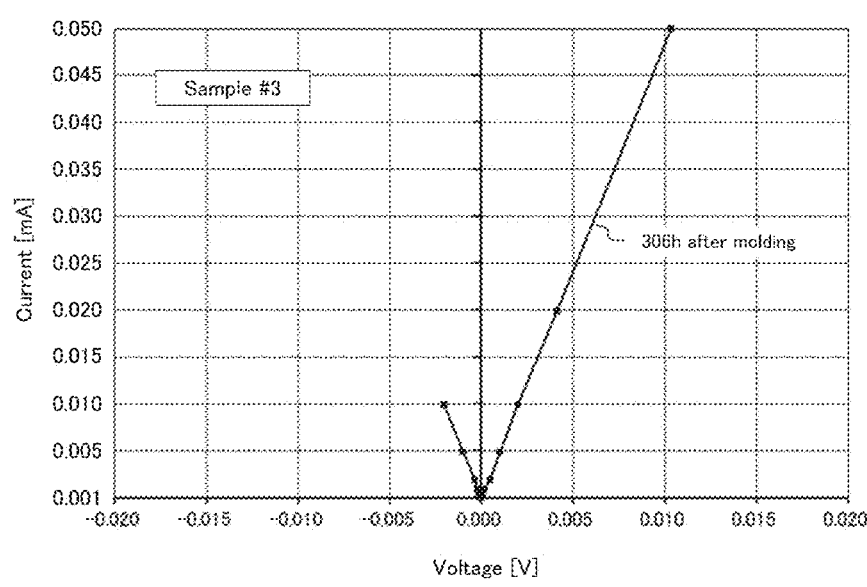
Figure 14:
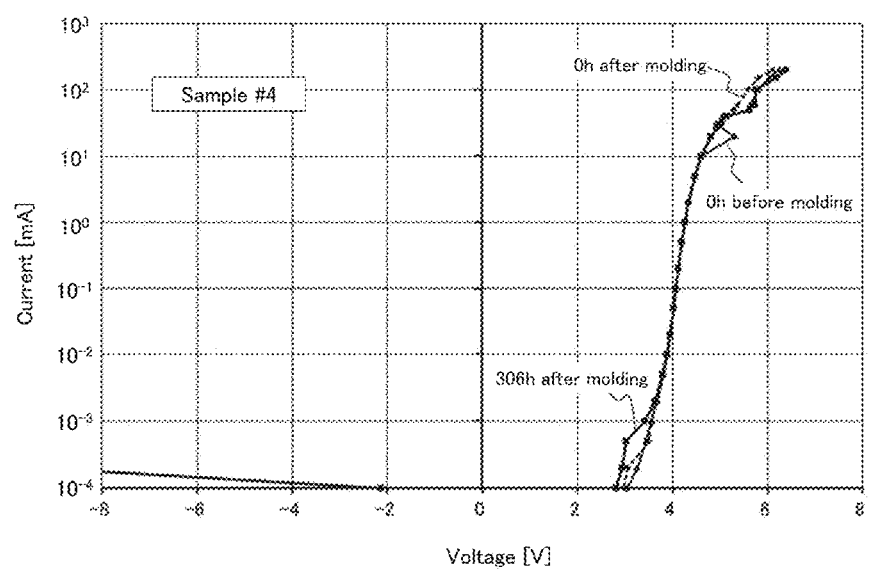
FIG. 14 is an I-V characteristic diagram for each elapsed time for the sample #4 used in the first verification experiment.
Figure 15:
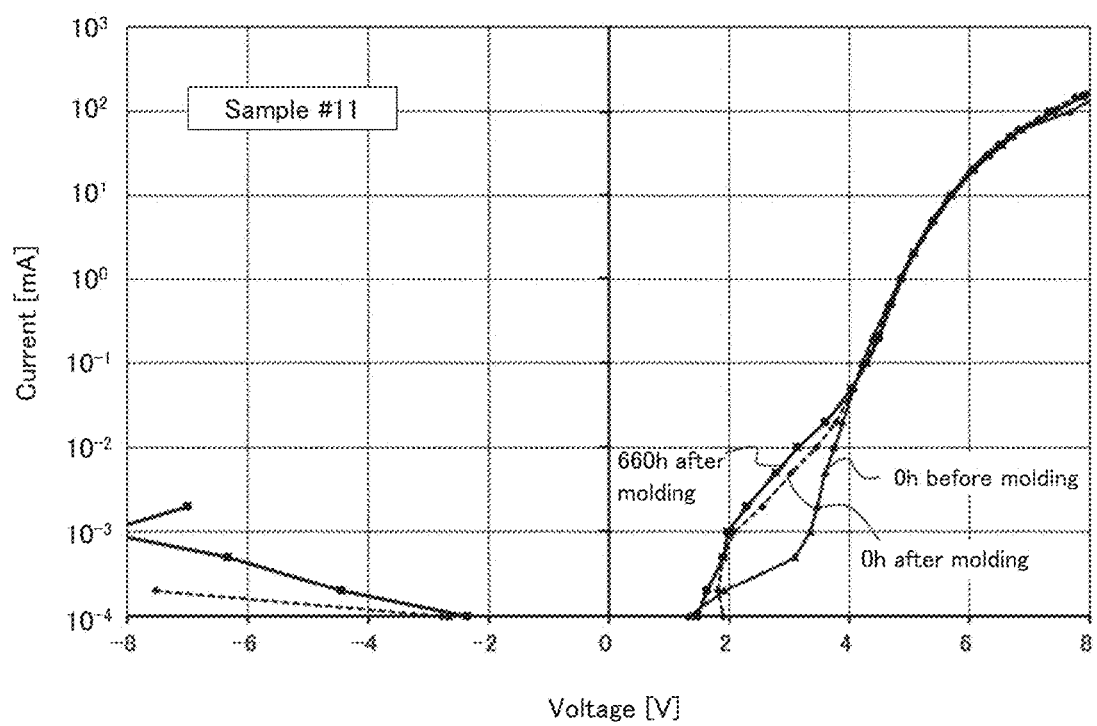
FIG. 15 is an I-V characteristic diagram for each elapsed time for the sample #11 used in the first verification experiment.

FIG. 11A shows I-V characteristics before resin sealing, after resin sealing and before the start of light emission and at the time of elapse of 105 hours after the start of light emission for the sample #1, and FIG. 11B shows an I-V characteristic at the time of elapse of 105 hours after the start of light emission for the sample #1 with the diagram enlarged at and around an applied voltage of 0 V. FIG. 12A shows I-V characteristics before resin sealing, after resin sealing and before the start of light emission and at the time of elapse of 32 hours after the start of light emission for the sample #2, and FIG. 12B shows an I-V characteristic at the time of elapse of 32 hours after the start of light emission for the sample #2 with the diagram enlarged at and around an applied voltage of 0 V. FIG. 13A shows I-V characteristics before resin sealing, after resin sealing and before the start of light emission and at the time of elapse of 306 hours after the start of light emission for the sample #3, and FIG. 13B shows an I-V characteristic at the time of elapse of 306 hours after the start of light emission for the sample #3 with the diagram enlarged at and around an applied voltage of 0 V. FIG. 14 shows I-V characteristics before resin sealing, after resin sealing and before the start of light emission and at the time of elapse of 306 hours after the start of light emission for the sample #4. FIG. 15 shows I-V characteristics before resin sealing, after resin sealing and before the start of light emission and at the time of elapse of 660 hours after the start of light emission for the sample #11. In FIGS. 11 to 15, each I-V curve before resin sealing is described as "0 h before Mold", each I-V curve after resin sealing and before the start of light emission is described as "0 h after Mold", and each I-V curve after resin sealing and the start of light emission and at the time of elapse of energization time for each sample is described as "MMh after Mold" (MM is an energization time for each sample).

It is apparent that in the samples #1 to #3 in which a light emission output defect occurs as shown in FIG. 10, the I-V characteristic is considerably changed after energization for the light emission operation is continued as shown in FIGS. 11 to 13, so that a short-circuit occurs between the anode and the cathode (between the p-electrode and the n-electrode). When comprehensively considering the fact that the I-V characteristic after a short-circuit has extremely high linearity as shown in FIGS. 11B to 13B in common, and the fact that for the light emission output defect, the short-circuit occurs in samples using the type A resin having a reactive terminal functional group having high bondability to a metal, and does not occur in samples using the type C resin having a nonreactive terminal functional group which is not bondable to a metal, etc., it is evident that the light emission output defect occurs due to a short-circuit between the anode and the cathode (between the p-electrode and the n-electrode), and the short-circuit is caused by the reactive terminal functional group of the type A resin.

On the other hand, when considering the fact that in the sample #4 which includes the type A resin having the same reactive terminal functional group and has a center emission wavelength of 290 nm, a light emission output defect similar to that in the samples #1 to #3 does not occur with an elapse time of about 300 hours, it is thought that in irradiation of ultraviolet light having a longer wavelength as compared to the samples #1 to #3, the level of the photochemical reaction is low, so that a coordinate bond is hard to be formed between a reactive terminal functional group and metal atoms.

Next, as a second verification experiment, the samples #5 and #12 were subjected to the light emission operation similarly to the samples #1 to #4, #11 and #15 and subjected to the same light emission output measurement and I-V characteristic measurement as in the first verification experiment, and presence/absence of abnormalities between the p-electrode 28 and the n-electrode 29 of each of the samples #5 and #12 was visually inspected.

In the sample #12 using the type C resin, similarly to the sample #11, a light emission output defect did not occur even after continuing the light emission operation for 283 hours, and a proper I-V characteristic was obtained. In the sample #5 prepared using the type A resin, a light emission output defect occurred similarly to other samples for comparison, i.e. the samples #1 to #3, the I-V characteristic was changed after elapse of 24 hours after the start of the light emission operation, and a short-circuit condition was observed between the anode and the cathode after elapse of 92 hours.

Figure 16:
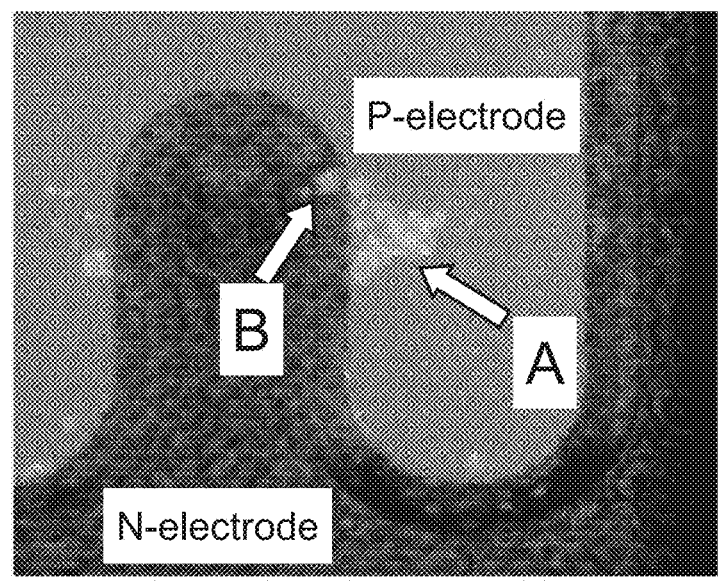
FIG. 16 is an optical microscope photograph subjected to a binarization treatment, which shows a result of observing the periphery of a p-electrode of an experimental sample #5 which is used in a second verification experiment for verifying an effect of suppressing a light emission output defect of the ultraviolet light emitting device according to the present invention and which suffers a light emission output defect.

Further, in visual inspection, as shown in the optical microscope photograph of FIG. 16, there was a trace (arrow A) where a metal seemed to migrate on the periphery of the p-electrode 28, and a mark (arrow B) supposed to be a short-circuit spot was observed in the sample #5 in which a light emission output defect occurred. On the other hand, in the sample #12 in which a light emission output defect did not occur, a trace where a metal migrated was not found on the periphery of the p-electrode 28.

The inspection results shown in FIG. 16 are consistent with the light emission output measurement results shown in FIG. 10 and the I-V characteristic measurement results shown in FIGS. 11 to 15, and it is apparent that the reactive terminal functional group of the type A resin causes a short-circuit to occur between the p-electrode 28 and the n-electrode 29, so that a forward voltage necessary for the light emission operation cannot be applied between the p-electrode 28 and the n-electrode 29, and therefore a light emission output defect occurs.

Figure 17:
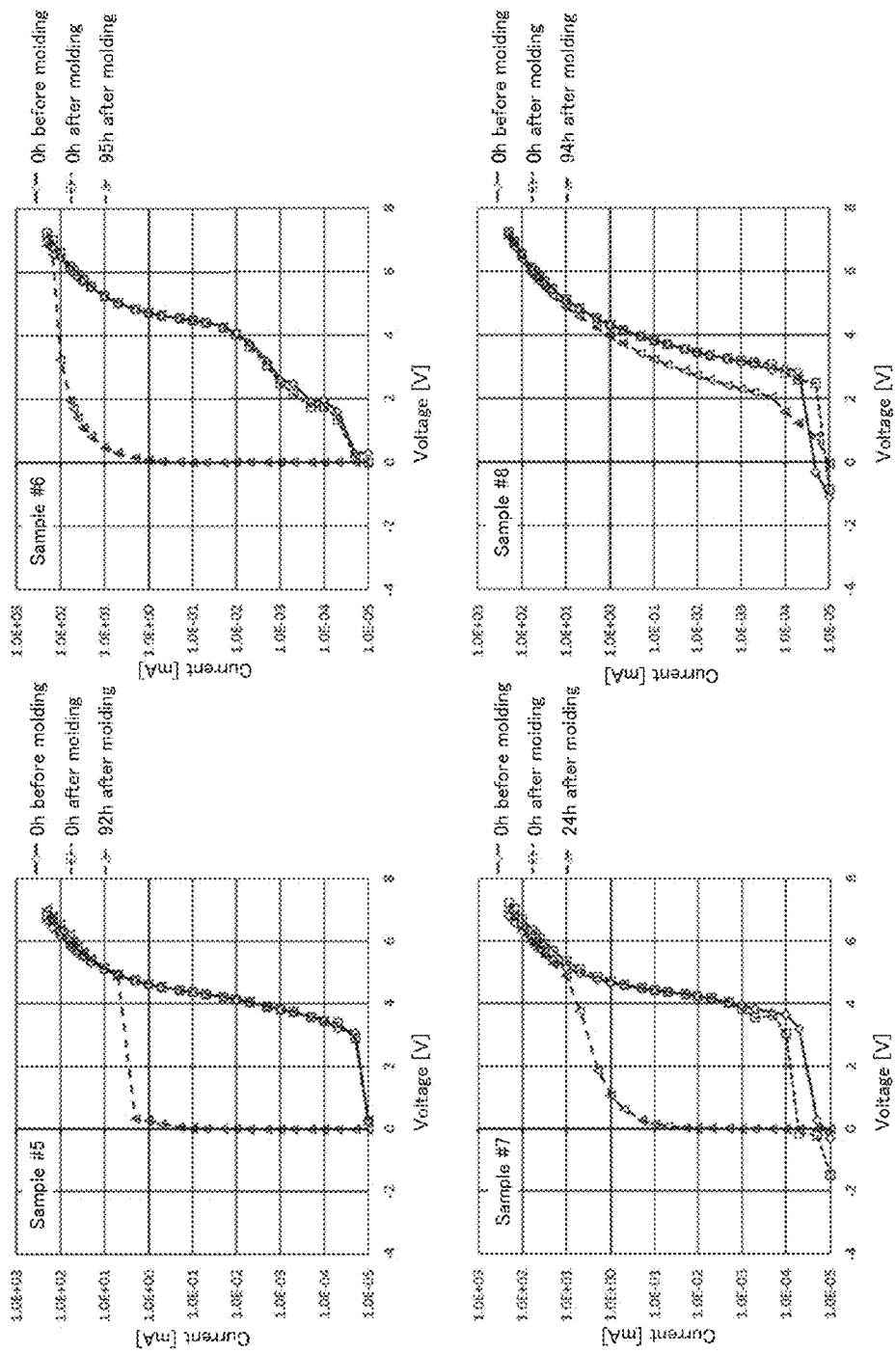
FIG. 17 is an I-V characteristic diagram for each elapsed time for the samples #5 to #8 using the type A resin.
Figure 18:
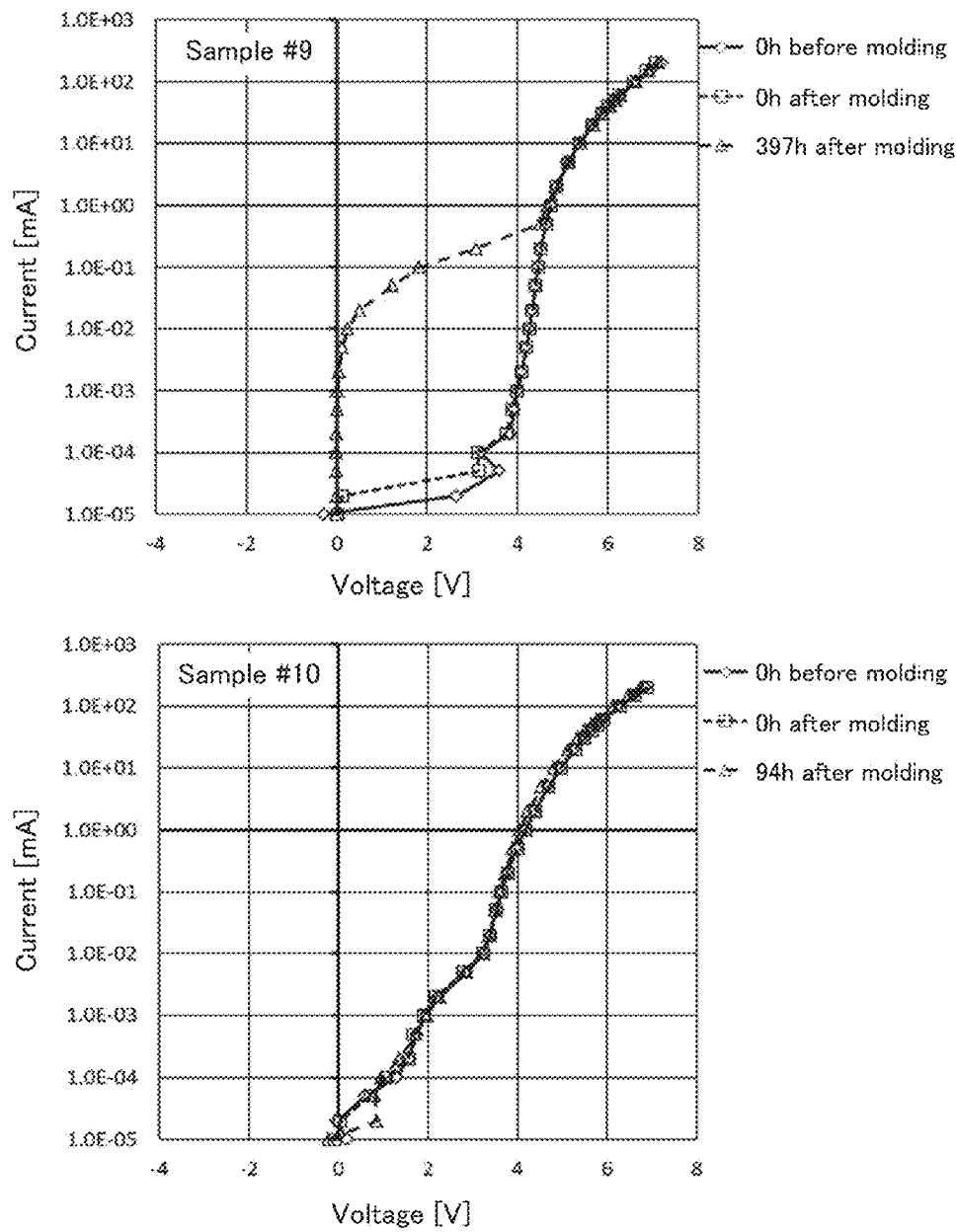
FIG. 18 is an I-V characteristic diagram for each elapsed time for the samples #9 to #10 using the type B resin.
Figure 19:
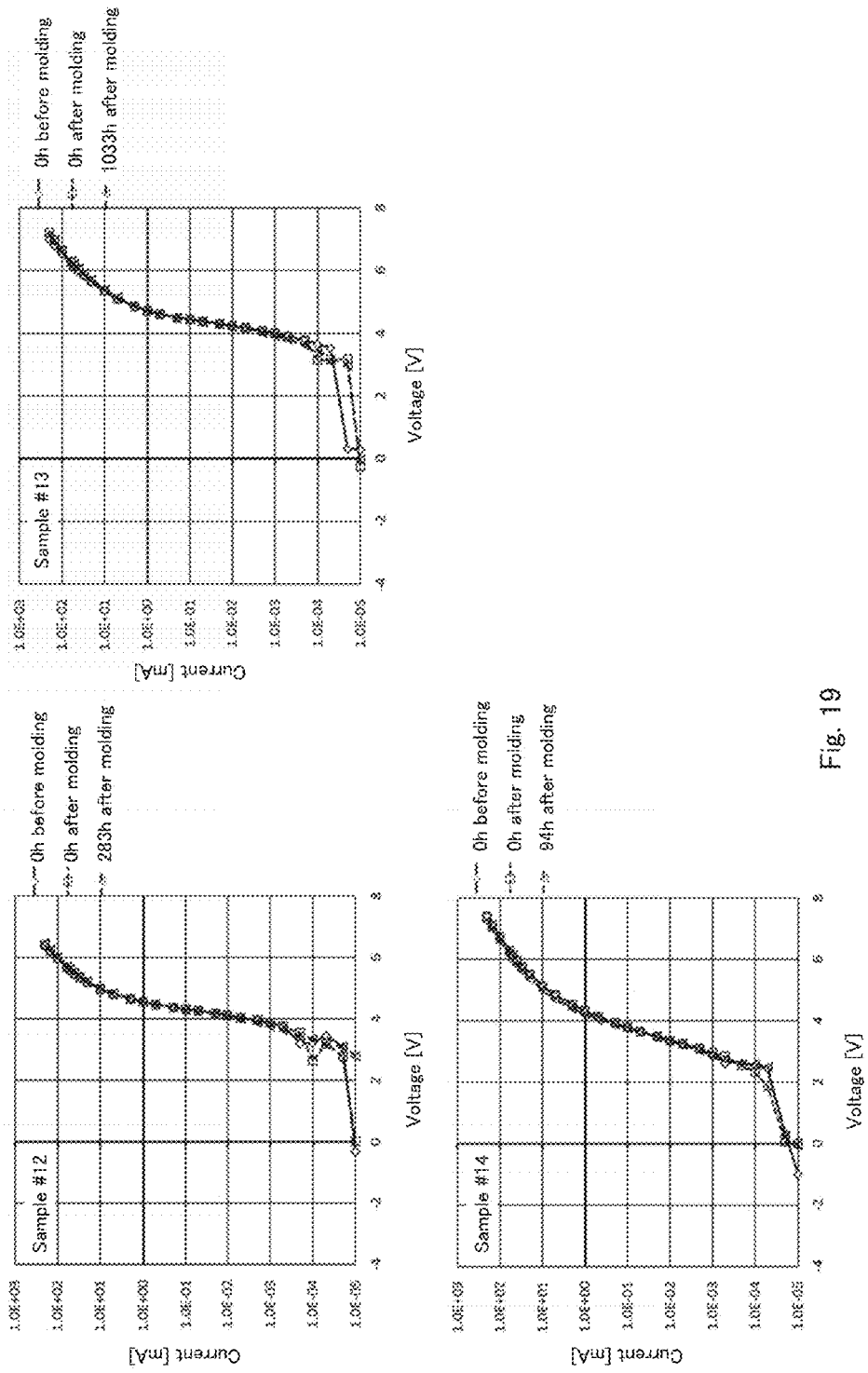
FIG. 19 is an I-V characteristic diagram for each elapsed time for the samples #12 to #14 using the type C resin.

Further, FIG. 17 shows IV characteristics at three time points: before resin sealing; after resin sealing and before the start of light emission; and after elapse of time appropriate to the sample after the start of light emission for the samples #5 to #8 including the type A resin, FIG. 18 shows IV characteristics at the above-mentioned three time points for the samples #9 and #10 including the type B resin, and FIG. 19 shows IV characteristics at the above-mentioned three time points for the samples #12 to #14 including the type C resin. The diagram in each of FIGS. 17 to 19 is drawn in the same manner as in FIGS. 11 to 15, and the elapse of time corresponding to each of the samples is as shown in each diagram.

From the IV characteristics shown in FIG. 17, it is apparent that in the samples #5 to #8 including the type A resin, a defect of rapid decrease in light emission output occurs for the samples #5, #6 and #7 having center emission wavelengths of about 268 nm, about 263 nm and about 265 nm, respectively, while such a defect does not occur for the sample #8 having a center emission wavelength of about 307 nm, as in the case of the samples #1 to #4 shown in FIGS. 11 to 14.

From the IV characteristics shown in FIG. 18, it is apparent that in the samples #9 and #10 including the type B resin having a reactive terminal functional group, a defect of rapid decrease in light emission output occurs for the sample #9 having a center emission wavelength of about 265 nm, while such a defect does not occur for the sample #10 having a center emission wavelength of about 305 nm, as in the case of the samples including the type A resin.

From the IV characteristics shown in FIG. 19, it is apparent that in the samples #12 to #14 including the type C resin and having a center emission wavelength of about 265 nm to 304 nm, a defect of rapid decrease in light emission output does not occur in the samples, as in the case of the sample #11 having a center emission wavelength of about 260 nm as shown in FIG. 15.

From the IV characteristics of the samples including the type A resin, the type B resin and the type C resin, it is evident that in the samples including the type A resin and the type B resin each having a reactive terminal functional group, the defect of rapid decrease in light emission output occurs when the center light emission wavelength in the ultraviolet light emitting element to be mounted is in the range of about 260 to 270 nm, while such a defect does not occur when the center emission wavelength is about 290 to 307 nm. This point will now be discussed while the spectral data of the ultraviolet transmittances of the type A resin and the type B resin shown in FIGS. 5 and 6 are compared with the light emission wavelength distributions of the samples #8 and #10 shown in FIG. 9.

First, for the sample #8 of the type A resin (center emission wavelength: about 307 nm), the short-wavelength edge of the light emission wavelength range (where the light emission spectral intensity is $1/100$ or more of the peak value) is 265.7 nm, and is therefore consistent with the long-wavelength edge (in the vicinity of 260 to 280 nm) of the absorption wavelength range in the type A resin as shown in FIG. 5. Since the above-mentioned defect does not occur in the sample #8, the light emission wavelength range in the ultraviolet light emitting element to be mounted does not overlap the absorption wavelength range in the type A resin as a sealing resin, or even if the light emission wavelength range in the ultraviolet light emitting element overlaps the absorption wavelength range in the type A resin, only the wavelength range where the light emission spectral intensity is about 1% or less of the peak value overlaps a skirt portion on the long-wavelength edge side of the absorption wavelength range in which the absorptivity is extremely small, and thus it can be determined that there is no problem in practical use. Further, this point is supported by the fact that the above-mentioned defect does not occur in the sample #4 having a further short center emission wavelength of 290 nm. In the sample #4, the full width at half maximum is about 12 nm, which is equivalent to about $2/3$ of the full width at half maximum in the sample #8 (about 19.0 nm), and therefore the short-wavelength edge of the light emission wavelength range defined as a wavelength range where the light emission spectral intensity is $1/100$ or more of the peak value is presumed to be in the vicinity of about 265 nm. Thus, the above-mentioned presumption from visual observation that the long-wavelength edge of the absorption wavelength range in the type A resin exists in the vicinity of 260 to 280 nm is appropriate in view of the results obtained from the IV characteristics of the samples #4 and #8. More specifically, in an ultraviolet light emitting device including the type A resin as a sealing resin, the short-wavelength edge of the light emission wavelength range (where the light emission spectral intensity is $1/100$ or more of the peak value) in the ultraviolet light emitting element to be mounted may be set to 260 to 265 nm or more, and by using an ultraviolet light emitting element having a center emission wavelength of 290 nm or more, more preferably 300 nm or more, the above-mentioned defect can be avoided. Given that the light emission wavelength range in the ultraviolet light emitting element to be mounted does not overlap the absorption wavelength range in the type A resin as a sealing resin, the long-wavelength edge of the absorption wavelength range in the type A resin is about 260 to 265 nm for the definition of the light emission wavelength range (where the light emission spectral intensity is $1/100$ or more of the peak value). When the definition of the light emission wavelength range is changed to a light emission wavelength range where the light emission spectral intensity is $2/100$ or more or $3/100$ or more of the peak value, the short-wavelength edge of each light emission wavelength range increases by about 5 nm to the vicinity of about 270 to 272 nm or the vicinity of about 275 to 277 nm from the vicinity of about 265 nm, and therefore the long-wavelength edge of the absorption wavelength range in the type A resin shifts to the vicinity of about 265 to 270 nm or the vicinity of about 270 to 275 nm. Thus, it is apparent that accurate definition of the long-wavelength edge of the absorption wavelength range in the type A resin is not very important itself, and it suffices that with respect to the definition of the light emission wavelength range, the long-wavelength edge is flexibly defined purposively within a range estimated by visual observation. In this embodiment, as one example, the light emission wavelength range is defined as a wavelength range where the light emission spectral intensity is $1/100$ or more of the peak value, and the long-wavelength edge of the absorption wavelength range in the type A resin is set to 265 nm. As another example, the light emission wavelength range may be defined as a wavelength range where the light emission spectral intensity is $2/100$ or more of the peak value, and the long-wavelength edge of the absorption wavelength range in the type A resin may be set to 270 nm, or the light emission wavelength range may be defined as a wavelength range where the light emission spectral intensity is $3/100$ or more of the peak value, and the long-wavelength edge of the absorption wavelength range in the type A resin may be set to 275 nm.

On the other hand, for the samples #1 to #3 and #5 to #7 of the type A resin, the short-wavelength edge of the light emission wavelength range (where the light emission spectral intensity is $1/100$ or more of the peak value) is presumed to be about 245 nm to 255 nm because the center emission wavelength in the ultraviolet light emitting element to be mounted is about 260 nm to about 270 nm and the full width at half maximum is about 12 nm, and it is apparent that the center emission wavelength is approximately consistent with the long-wavelength edge of the absorption wavelength range in the type A resin, and therefore in comparison with the spectral data of the ultraviolet transmittance of the type A resin shown in FIG. 5, approximately a half of light in the light emission wavelength range is evidently absorbed in the type A resin, so that the above-mentioned defect occurs.

Next, for the sample #10 of the type B resin (center emission wavelength: about 305 nm), the short-wavelength edge of the light emission wavelength range (where the light emission spectral intensity is $1/100$ or more of the peak value) is 265.4 nm, and is therefore consistent with the long-wavelength edge (in the vicinity of 255 to 275 nm) of the absorption wavelength range in the type B resin as shown in FIG. 6. Since the above-mentioned defect does not occur in the sample #10, the light emission wavelength range in the ultraviolet light emitting element to be mounted does not overlap the absorption wavelength range in the type B resin as a sealing resin, or even if the light emission wavelength range in the ultraviolet light emitting element overlaps the absorption wavelength range in the type B resin, only the wavelength range where the light emission spectral intensity is about 1% or less of the peak value overlaps a skirt portion on the long-wavelength edge side of the absorption wavelength range in which the absorptivity is extremely small, and thus it can be determined that there is no problem in practical use. Thus, the above-mentioned presumption from visual observation that the long-wavelength edge of the absorption wavelength range in the type B resin exists in the vicinity of 255 to 275 nm is appropriate in view of the results obtained from the IV characteristics of the sample #10. More specifically, in an ultraviolet light emitting device including the type B resin as a sealing resin, the short-wavelength edge of the light emission wavelength range (where the light emission spectral intensity is $1/100$ or more of the peak value) in the ultraviolet light emitting element to be mounted may be set to 255 to 265 nm or more, and by using an ultraviolet light emitting element having a center emission wavelength of 290 nm or more, more preferably 300 nm or more, the above-mentioned defect can be avoided. Given that the light emission wavelength range in the ultraviolet light emitting element to be mounted does not overlap the absorption wavelength range in the type B resin as a sealing resin, the long-wavelength edge of the absorption wavelength range in the type B resin is about 255 to 265 nm for the definition of the light emission wavelength range (where the light emission spectral intensity is $1/100$ or more of the peak value). When the definition of the light emission wavelength range is changed to a light emission wavelength range where the light emission spectral intensity is $2/100$ or more or $3/100$ or more of the peak value, the short-wavelength edge of each light emission wavelength range increases by about 5 nm to the vicinity of about 270 to 272 nm or the vicinity of about 275 to 277 nm from the vicinity of about 265 nm, and therefore the long-wavelength edge of the absorption wavelength range in the type B resin shifts to the vicinity of about 260 to 270 nm or the vicinity of about 265 to 275 nm. Thus, it is apparent that accurate definition of the long-wavelength edge of the absorption wavelength range in the type B resin is not very important itself, and it suffices that with respect to the definition of the light emission wavelength range, the long-wavelength edge is flexibly defined purposively within a range estimated by visual observation. In this embodiment, the absorption wavelength range in the type B resin is recognized to exist slightly on a shorter-wavelength side as compared to the absorption wavelength range in the type A resin as shown in FIGS. 5 and 6, and therefore as one example, the light emission wavelength range is defined as a wavelength range where the light emission spectral intensity is $1/100$ or more of the peak value, and the long-wavelength edge of the absorption wavelength range in the type B resin is set to 260 nm. As another example, the light emission wavelength range may be defined as a wavelength range where the light emission spectral intensity is $2/100$ or more of the peak value, and the long-wavelength edge of the absorption wavelength range in the type B resin may be set to 265 nm, or the light emission wavelength range may be defined as a wavelength range where the light emission spectral intensity is $3/100$ or more of the peak value, and the long-wavelength edge of the absorption wavelength range in the type B resin may be set to 270 nm.

On the other hand, for the sample #9 of the type B resin, the short-wavelength edge of the light emission wavelength range (where the light emission spectral intensity is $1/100$ or more of the peak value) is presumed to be about 250 nm because the center emission wavelength in the ultraviolet light emitting element to be mounted is about 265 nm and the full width at half maximum is about 12 nm, and it is apparent that the center emission wavelength is positioned on a shorter-wavelength side as compared to the long-wavelength edge of the absorption wavelength range in the type B resin, and therefore in comparison with the spectral data of the ultraviolet transmittance of the type B resin shown in FIG. 6, approximately a half of light in the light emission wavelength range is evidently absorbed in the type B resin, so that the above-mentioned defect occurs.

Next, for the samples #11 to 14 of the type C resin (center emission wavelength: about 260 to 305 nm), the short-wavelength edge of the light emission wavelength range (where the light emission spectral intensity is $1/100$ or more of the peak value) is presumed to be about 245 nm to about 264 nm, and since the above-mentioned defect does not occur in any of these samples, the long-wavelength edge of the absorption wavelength range of the type C resin is considered to be a shorter wavelength than a wavelength in the vicinity of 240 nm even though it exists in a wavelength range of not less than 200 nm. This point is in agreement with the fact that the absorption wavelength range estimated by visual observation from the spectral data of the type C resin shown in FIG. 7 does not exist on a longer-wavelength side as compared to a wavelength in the vicinity of 220 nm.

The result of an experiment will now be described in which the type A resin having a COOH group as a reactive terminal functional group is irradiated with ultraviolet light having a center emission wavelength of about 260 nm, and components of a gas generated from the type A resin by the irradiation are analyzed. The experiment was conducted in the following manner: two samples were provided, i.e. the type A resin which was irradiated with the ultraviolet light for 479 hours after the type A resin was dissolved in a solvent and dried at 200° C. for 1 hour to remove the solvent and the type A resin which was not irradiated with the ultraviolet light after the type A resin was dissolved in a solvent and dried at 200° C. for 1 hour to remove the solvent, and these samples were each subjected to TPD/MS (temperature programmed desorption/mass spectrometry) measurement, and a generated gas was analyzed. From the TPD/MS measurement for the two samples, it was confirmed that the gas generated from the sample irradiated with the ultraviolet light contained $H_2O$, $CO_2$ and CO, particularly significantly $H_2O$ and CO. On the other hand, the sample which was not irradiated with the ultraviolet light did not generate $CO_2$ and CO as compared to the sample which was irradiated with the ultraviolet light. Comparison between both the samples showed that they were greatly different in generation of CO. From the above measurement result, it is evident that the COOH group as a reactive terminal functional group of the type A resin was decomposed by the ultraviolet light to generate $H_2O$, $CO_2$ and CO. It is considered that accordingly, these generated gases, particularly CO, are radicalized to form a coordinate bond with metal atoms that form a pad electrode, the metal atoms are thus separated from the pad electrode, and resultantly migrate, and a resistant leak current path is thus formed between the p-electrode and the n-electrode of the ultraviolet light emitting element to cause a short-circuit, so that the above-mentioned defect of rapid decrease in light emission output occurs.

It is thought that since the separation distance between the p-electrode 28 and the n-electrode 29 (between the pad electrodes 16 and 17) is shorter than the separation distance between the first and second metal electrode wirings 11 and 12, the electric field between the p-electrode 28 and the n-electrode 29 is larger than that between the first and second metal electrode wirings 11 and 12, so that the short-circuit easily occurs. However, when the separation distance between the first and second metal electrode wirings 11 and 12 is as short as the same between the pad electrodes 16 and 17 of the ultraviolet light emitting element 2, a similar short-circuit phenomenon may occur.

Thus, it has been confirmed from the verification experiments that in the present invention device, even when at least a part of the sealing resin 3 (resin film 3a) covering the metal-exposed portion is the first type amorphous fluororesin (type A resin or type B resin) having a COOH group or a COOR group as a reactive terminal functional group, occurrence of the light emission output defect caused by the reactive terminal functional group is effectively suppressed by setting the light emission wavelength range in the ultraviolet light emitting element 2 so as to be positioned on a longer-wavelength side as compared to the absorption wavelength range in the first type amorphous fluororesin.

Another Embodiments

In the embodiment described above, one example of a preferred embodiment of the present invention device has been described in detail. The configuration of the present invention device is not limited to the embodiment described above, but various modifications can be made without departing from the spirit of the present invention. Hereinafter, another aspect of the present invention device will be described.

<1> In the embodiment described above, the ultraviolet light emitting element 2 is intended to be an ultraviolet light emitting diode having the structure illustrated in FIG. 3, but the ultraviolet light emitting element 2 is not limited to one having the structure shown in FIG. 3 as long as it is a nitride semiconductor light emitting element, and not only light emitting diodes but also semiconductor lasers are included.

<2> In the embodiment described above, a case is illustrated where a bare chip of one ultraviolet light emitting element 2 is placed on the sub-mount 1 having the shape illustrated in FIG. 1, thereby forming the present invention device. However, in the case where the sub-mount 1 is used, the shape, structure and material thereof are not limited to those illustrated in the embodiment described above. For example, the inner wall of the side wall portion 13 of the sub-mount 1 may be shaped into an inclined surface, and provided with a metallic surface to reflect ultraviolet light. Further, rather than placing one ultraviolet light emitting element 2 on one sub-mount 1, bare chips of a plurality of ultraviolet light emitting elements 2 may be placed directly on another board, followed by separately sealing the individual ultraviolet light emitting elements 2 with the sealing resin 3.

Further, in the embodiment described above, a case is illustrated where the pad electrodes 16 and 17 of the ultraviolet light emitting element 2 are connected, respectively, to the first and second metal electrode wirings 11 and 12 formed on the surface of the sub-mount 1, but a structure may be employed in which the first and second metal electrode wirings 11 and 12 connected to the pad electrodes 16 and 17 are metal members in contact with the pad electrodes 16 and 17, such as a lead frame, rather than thin film-shaped metal wirings formed on the sub-mount 1 or printed board, and the metal members are sealed with the sealing resin together with the ultraviolet light emitting element 2 without being in contact with an insulating member such as the sub-mount 1 or printed board.

In the embodiment described above, a case is illustrated where the ultraviolet light emitting element 2 is mounted on the sub-mount 1 by so called flip chip mounting, but for example when emitted light from the ultraviolet light emitting element 2 is extracted from the upper surface of the chip, connection of the pad electrodes 16 and 17 and the first and second metal electrode wirings 11 and 12, etc. may be performed by wire bonding with the rear surface of the bare chip of the ultraviolet light emitting element 2 being placed on the sub-mount 1, the printed board or the lead frame.

<3> In the embodiment described above, the case where the resin film 3a covering the metal-exposed portion is fully composed of the first type amorphous fluororesin is sown as an example, but the second type amorphous fluororesin having a nonreactive terminal functional group may also be contained.

<4> In the embodiment described above, the case where the terminal functional group of the first type amorphous fluororesin is a COOH group or a COOR group as a reactive functional group is shown as an example, and the light emission wavelength range and the center emission wavelength in the ultraviolet light emitting element in this case are described in detail, but the terminal functional group of the first type amorphous fluororesin is not limited to a COOH group and a COOR group. When the long-wavelength edge of the absorption wavelength range in an amorphous fluororesin having as a terminal functional group a reactive functional group other than a COOH group and a COOR group is, for example, within the range of 200 nm to 365 nm, a situation in which the reactive functional group is decomposed by ultraviolet light outputted from the ultraviolet light emitting element, and the decomposed substance is radicalized to form a coordinate bond with metal atoms that form a pad electrode is prevented by setting the short-wavelength edge of the light emission wavelength range in the ultraviolet light emitting element is set on a longer-wavelength side as compared to the long-wavelength edge within the range of 200 nm to 365 nm. As a result, a situation in which the metal atoms migrate, and a resistant leak current path is thus formed between the p-electrode and the n-electrode of the ultraviolet light emitting element to cause a short-circuit, so that the above-mentioned defect of rapid decrease in light emission output occurs is suppressed as in the present invention device of the above-described embodiment in which the terminal functional group is a COOH group or a COOR group.

<5> In the embodiment described above, the long-wavelength edge of the absorption wavelength range in each of the type A resin and the type B resin is roughly estimated by visually observing the spectral data of the ultraviolet transmittance. A design guideline is established such that in accordance with the determination criterion of whether or not the reactive terminal functional group is decomposed by ultraviolet light actually outputted from an ultraviolet light emitting element, so that a defect occurs in the light emission output, the long-wavelength edge estimated by visual observation is further limited based on the relationship with the short-wavelength edge of the light emission wavelength range in the ultraviolet light emitting element, and the short-wavelength edge of the light emission wavelength range in the ultraviolet light emitting element is set on a longer-wavelength side as compared to the limited long-wavelength edge of the absorption wavelength range. Here, as one example of the definition of the light emission wavelength range in the ultraviolet light emitting element, a light emission wavelength range where the light emission spectral intensity is 1% or more of the peak value is employed.

However, when the spectral data of the ultraviolet transmittance of the first type amorphous fluororesin to be used does not include variations due to measurement errors as shown in FIG. 5 or 6, and shows a characteristic in which the transmittance monotonously changes with a change in wavelength in the absorption wavelength range, or when the spectral data includes variations due to measurement errors (for example, the transmittance changes upward and downward with a change in wavelength as shown in FIGS. 5 and 6), but a characteristic curve in which the transmittance monotonously changed with a change in wavelength is obtained by subjecting the spectral data to well known curve fitting processing or smoothing processing, a long-wavelength edge at a certain degree of accuracy may be directly extracted from the spectral data, and the short-wavelength edge of the light emission wavelength range in the ultraviolet light emitting element may be set on a longer-wavelength side as compared to the extracted long-wavelength edge without determining whether or not the reactive terminal functional group is decomposed by ultraviolet light actually outputted from the ultraviolet light emitting element, so that a defect occurs in the light emission output.

INDUSTRIAL APPLICABILITY

The ultraviolet light emitting device according to the present invention can be used as an ultraviolet light emitting device using an amorphous fluororesin as a sealing resin for sealing an ultraviolet light emitting element.

DESCRIPTION OF SYMBOLS

1 Sub-mount (base)
2 Ultraviolet light emitting element
3 Sealing resin
3a, 3b Resin film
4 Light condensing lens
5 Bump material
6 Coating solution
10 Substrate
11 First metal electrode wiring
12 Second metal electrode wiring
12a Projected portion of second metal electrode wiring
13 Side wall portion
14, 15 Lead terminal
16, 17 Pad electrode
18 Gap
20 Sapphire substrate
21 AlN layer
22 AlGaN layer
23 n-type clad layer (n-type AlGaN)
24 Active layer
25 Electron blocking layer (p-type AlGaN)
26 p-type clad layer (p-type AlGaN)
27 p-contact layer (p-type GaN)
28 p-electrode
29 n-electrode
30 Protective insulating film
A1 First region
A2 Second region

The invention claimed is:
1. An ultraviolet light emitting device comprising: an ultraviolet light emitting element composed of a nitride semiconductor having a light emission wavelength range with a short wavelength edge where a light emission spectral intensity of the ultraviolet light emitting element is 1% or more of a peak value; and an ultraviolet-transparent sealing resin covering the ultraviolet light emitting element, wherein at least a specific portion of the sealing resin, which is in contact with both p-electrode and n-electrode pads of the ultraviolet light emitting element, is a first type amorphous fluororesin, a terminal functional group of a polymer or a copolymer that forms the first type amorphous fluororesin includes a COOH group or a COOR group as a reactive functional group bondable to a metal that forms the p-electrode and n-electrode pads, with the proviso that R in the COOR is an alkyl group, and a wavelength at the short wavelength edge of the light emission wavelength range is 265 nm or more in the case where the terminal functional group is the COOH group, and 260 nm or more in the case where the terminal functional group is the COOR group.

2. The ultraviolet light emitting device according to claim 1, wherein a center emission wavelength of the ultraviolet light emitting element is 290 nm or more and 365 nm or less.

3. The ultraviolet light emitting device according to claim 1, wherein a structural unit that forms the polymer or the copolymer has a fluorine-containing aliphatic cyclic structure.

4. The ultraviolet light emitting device according to claim 1, comprising a base with first and second metal electrode wirings formed on a part of a surface of a substrate, wherein
the ultraviolet light emitting element is placed on the base, and
the p-electrode and n-electrode pads of the ultraviolet light emitting element are electrically connected to the first and second metal electrode wirings, respectively.

5. The ultraviolet light emitting device according to claim 4, wherein the p-electrode and n-electrode pads and the first and second metal electrode wirings face each other, and are electrically and physically connected to each other with bump material interposed therebetween, and
an air gap between a side of the ultraviolet light emitting element provided with the p-electrode and n-electrode pads and an upper surface of the base is filled with the first type amorphous fluororesin.

6. The ultraviolet light emitting device according to claim 4, wherein a portion of the sealing resin, which is in contact with the metal electrode wiring, is the first type amorphous fluororesin.

7. The ultraviolet light emitting device according to claim 1, wherein a portion other than the specific portion in the sealing resin is the first type amorphous fluororesin, or a second type amorphous fluororesin having a terminal functional group different from that of the first type amorphous fluororesin, and a terminal functional group of a polymer or a copolymer that forms the second type amorphous fluororesin is a nonreactive functional group which is not bondable to a metal that forms the p-electrode and n-electrode pads.

8. The ultraviolet light emitting device according to claim 7, wherein the nonreactive functional group is a perfluoroalkyl group.

9. The ultraviolet light emitting device according to claim 8, wherein the nonreactive functional group is $CF_3$.

10. The ultraviolet light emitting device according to claim 1, wherein the ultraviolet light emitting element is mounted on a base by flip-chip mounting so that a lower surface of the ultraviolet light emitting element and an upper surface of the base are opposed to each other, and
the specific portion of the sealing resin is further in direct contact with an entire upper surface and an entire side surface of the ultraviolet light emitting element.

* * * * *